(12) United States Patent
Yamazaki et al.

(10) Patent No.: US 8,492,764 B2
(45) Date of Patent: Jul. 23, 2013

(54) LIGHT-EMITTING DEVICE AND MANUFACTURING METHOD THEREOF

(75) Inventors: Shunpei Yamazaki, Setagaya (JP); Masayuki Sakakura, Tochigi (JP); Junichiro Sakata, Atsugi (JP); Masashi Tsubuku, Atsugi (JP); Kengo Akimoto, Atsugi (JP); Miyuki Hosoba, Isehara (JP); Yoshiaki Oikawa, Sagamihara (JP)

(73) Assignee: Semicondcutor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 181 days.

(21) Appl. No.: 12/848,375

(22) Filed: Aug. 2, 2010

(65) Prior Publication Data

US 2011/0031496 A1    Feb. 10, 2011

(30) Foreign Application Priority Data

Aug. 7, 2009  (JP) .................................. 2009-185252

(51) Int. Cl.
*H01L 29/786*  (2006.01)
*H01L 21/336*  (2006.01)
*H01L 33/00*   (2010.01)

(52) U.S. Cl.
USPC .......... 257/59; 257/43; 257/13; 257/E29.117; 257/E29.296; 257/E33.001; 438/104; 438/22

(58) Field of Classification Search
USPC ............... 257/59, 43, 13, E29.117, E29.296, 257/E33.001; 438/104, 22
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,261,881 B1 | 7/2001 | Yamazaki et al. |

(Continued)

FOREIGN PATENT DOCUMENTS

| EP | 1737044 A | 12/2006 |
| EP | 1770788 A | 4/2007 |

(Continued)

OTHER PUBLICATIONS

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

(Continued)

*Primary Examiner* — Matthew Reames
*Assistant Examiner* — Benjamin Tzu-Hung Liu
(74) *Attorney, Agent, or Firm* — Eric J. Robinson; Robinson Intellectual Property Law Office, P.C.

(57) ABSTRACT

A light-emitting device in which plural kinds of circuits are formed over one substrate and plural kinds of thin film transistors in accordance with characteristics of the plural kinds of circuits are included. An inverted-coplanar thin film transistor including an oxide semiconductor layer which overlaps a source and drain electrode layers is used as a thin film transistor for a pixel, a channel-stop thin film transistor is used as a thin film transistor for a driver circuit, and a color filter layer is provided between the thin film transistor for a pixel and a light-emitting element so as to overlap the light-emitting element which is electrically connected to the thin film transistor for a pixel.

8 Claims, 16 Drawing Sheets

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,738,109 B2 | 5/2004 | Jeon |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,719,185 B2 | 5/2010 | Jin et al. |
| 7,732,819 B2 | 6/2010 | Akimoto et al. |
| 7,745,798 B2 | 6/2010 | Takahashi |
| 7,915,689 B2 * | 3/2011 | Cho et al. .................. 257/390 |
| 7,943,985 B2 * | 5/2011 | Kim et al. .................. 257/327 |
| 8,017,947 B2 * | 9/2011 | Kim et al. .................. 257/59 |
| 8,022,411 B2 * | 9/2011 | Yoon et al. .................. 257/72 |
| 8,110,436 B2 | 2/2012 | Hayashi et al. |
| 8,232,551 B2 | 7/2012 | Kim et al. |
| 2001/0030323 A1 | 10/2001 | Ikeda |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0232421 A1 | 11/2004 | Ono et al. |
| 2005/0017302 A1 | 1/2005 | Hoffman |
| 2005/0023526 A1 * | 2/2005 | Yamazaki .................. 257/59 |
| 2005/0073051 A1 | 4/2005 | Yamamoto et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252145 A1 | 11/2007 | Toyota et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0157081 A1 | 7/2008 | Huh |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0246033 A1 | 10/2008 | Huh et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0152506 A1 | 6/2009 | Umeda et al. |
| 2009/0152541 A1 | 6/2009 | Maekawa et al. |
| 2009/0189155 A1 | 7/2009 | Akimoto |
| 2009/0189156 A1 | 7/2009 | Akimoto |
| 2009/0225251 A1 | 9/2009 | Kaitoh et al. |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0044696 A1 | 2/2010 | Cheng et al. |
| 2010/0044701 A1 | 2/2010 | Sano et al. |
| 2010/0059751 A1 | 3/2010 | Takahashi et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163863 A1 * | 7/2010 | Yaegashi .................. 257/43 |
| 2010/0244022 A1 | 9/2010 | Takahashi et al. |
| 2010/0295042 A1 | 11/2010 | Yano et al. |
| 2011/0012112 A1 | 1/2011 | Yamazaki et al. |
| 2011/0012116 A1 | 1/2011 | Yamazaki et al. |
| 2011/0031492 A1 | 2/2011 | Yamazaki et al. |
| 2011/0031493 A1 | 2/2011 | Yamazaki et al. |
| 2011/0031497 A1 | 2/2011 | Yamazaki et al. |
| 2011/0032444 A1 | 2/2011 | Yamazaki et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 | 9/1993 |
| JP | 08-264794 | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-029293 | 1/2003 |
| JP | 2003-086000 | 3/2003 |
| JP | 2003-086808 | 3/2003 |
| JP | 2004-103957 | 4/2004 |
| JP | 2004-273614 A | 9/2004 |
| JP | 2004-273732 A | 9/2004 |
| JP | 2007-081362 | 3/2007 |

| JP | 2007-096055 | 4/2007 |
| JP | 2007-123861 | 5/2007 |
| JP | 2007-163467 | 6/2007 |
| JP | 2007-171932 | 7/2007 |
| JP | 2009-265271 | 11/2009 |
| JP | 2010-098280 | 4/2010 |
| WO | WO 2004/114391 | 12/2004 |
| WO | WO-2008/105347 | 9/2008 |
| WO | WO-2009/093722 | 7/2009 |

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Takahashi et al., "Theoretical Analysis of IGZO Transparent Amorphous Oxide Semiconductor," IDW '08: Proceedings of the 15$^{th}$ International Display Workshops, Dec. 3, 2008, pp. 1637-1640.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—Zno System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Osada et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Li et al., "Modulated Structures of Homologous Compounds $InMO_3(ZnO)m$ (M=In,Ga; m=Integer) Described by Four-Dimensional Superspace Group," Journal of Solid State Chemistry, 1998, vol. 139, pp. 347-355.

Lee et al., "World'S Largest (15-Inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUS on Flexible and Glass Substrates for Secure RFID Systems," Journal of Solid-State Circuits, 2008, vol. 43, No. 1, pp. 292-299.

Ohara et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display With Driver Circuit Using Amorphous In—Ga—Zn-Oxide TFTS," IDW '09: Proceedings of the 16$^{th}$ International Display Workshops, 2009, pp. 689-692.

Park et al., "Amorphous Indium-Gallium-Zinc Oxide TFTS and Their Application for Large Size AMOLED," AM-FPD '08 Digest of Technical Papers, Jul. 2, 2008, pp. 275-277.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Osada et al., "Development of Driver-Integrated Panel Using Amorphous In—Ga—Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTS) for AMLCDS," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Ohara et al., "21.3: 4.0 In. QVGA AMOLED Display Using In—Ga—Zn-Oxide TFTS With a Novel Passivation Layer," SID Digest '09: SID International Symposium Digest of Technical Papers, May 31, 2009, pp. 284-287.

Miyasaka, "Suftla Flexible Microelectronics on Their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Lee et al., "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "Polymer-Stabilized Liquid Crystal Blue Phases," Nature Materials, Sep. 1, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, Or Al; B: Mg, Mn, Fe, Ni, Cu, or Zn] at Temperatures Over 1000° C." Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Nakamura.M, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 0455501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Tetsuo Nozawa, "Transparent Circuit,", Nikkei Electronics, Aug. 27, 2007, No. 959, pp. 39-52.

* cited by examiner

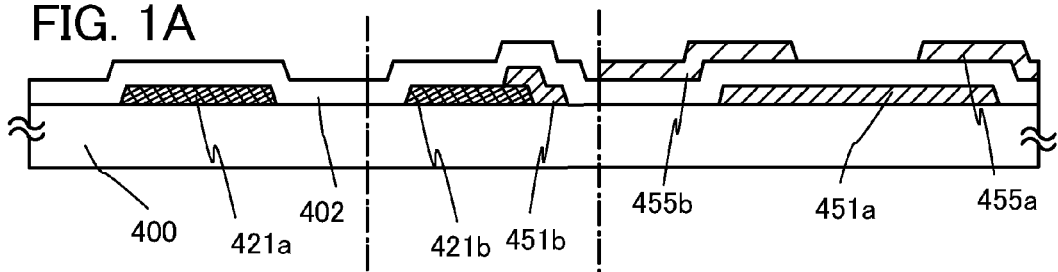
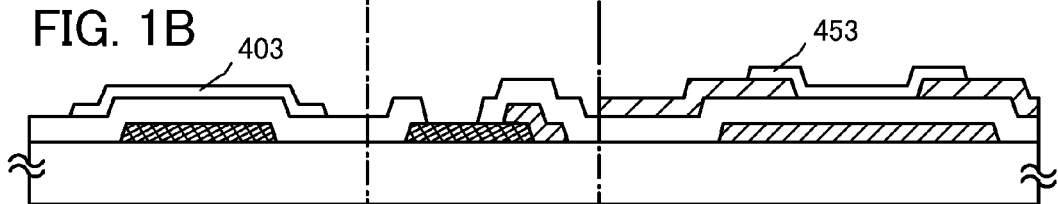
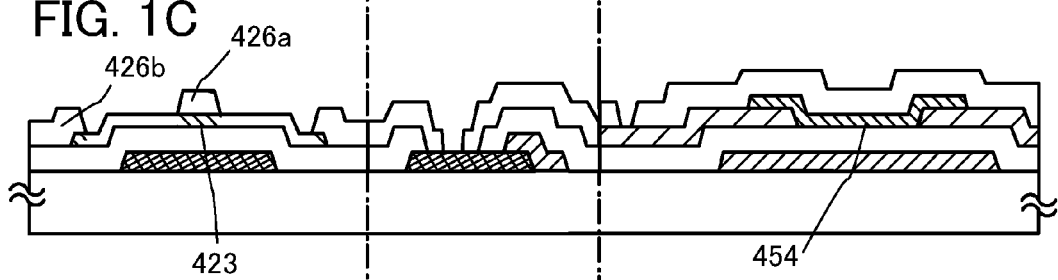
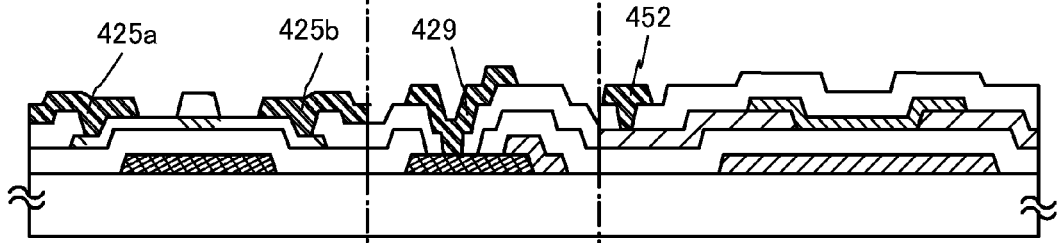
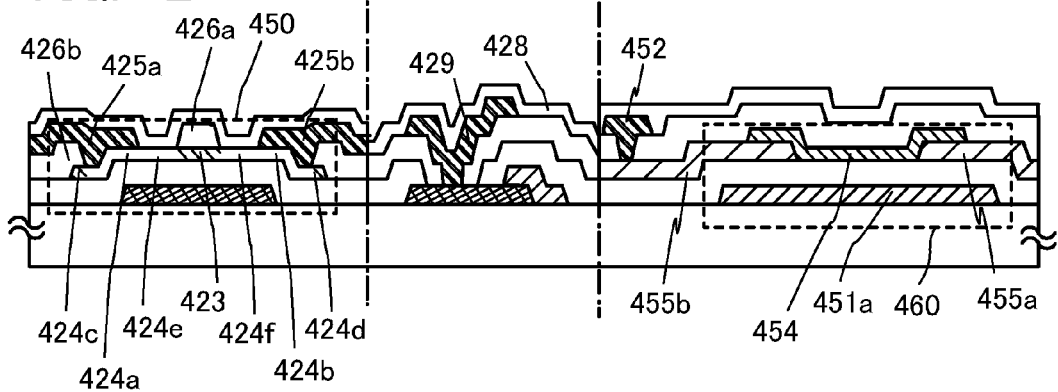

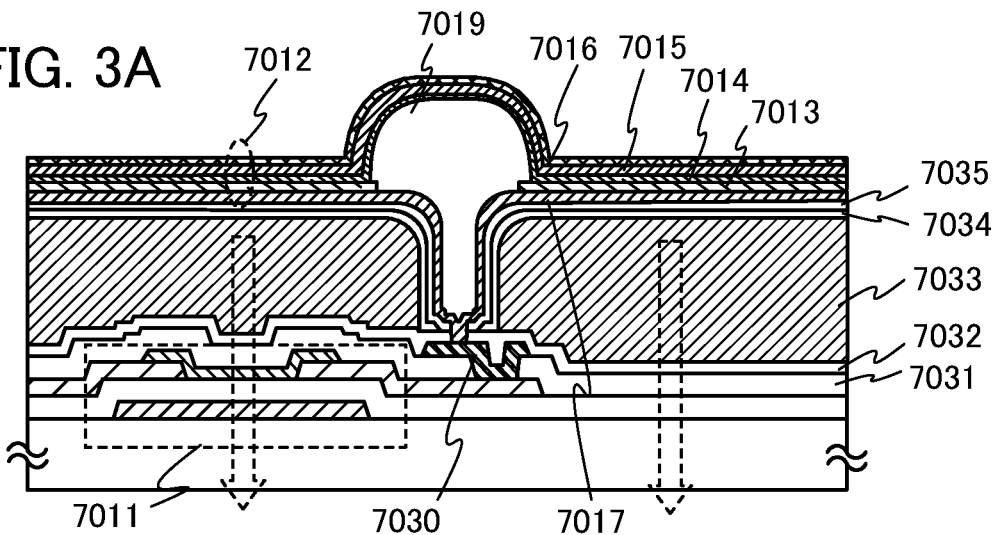
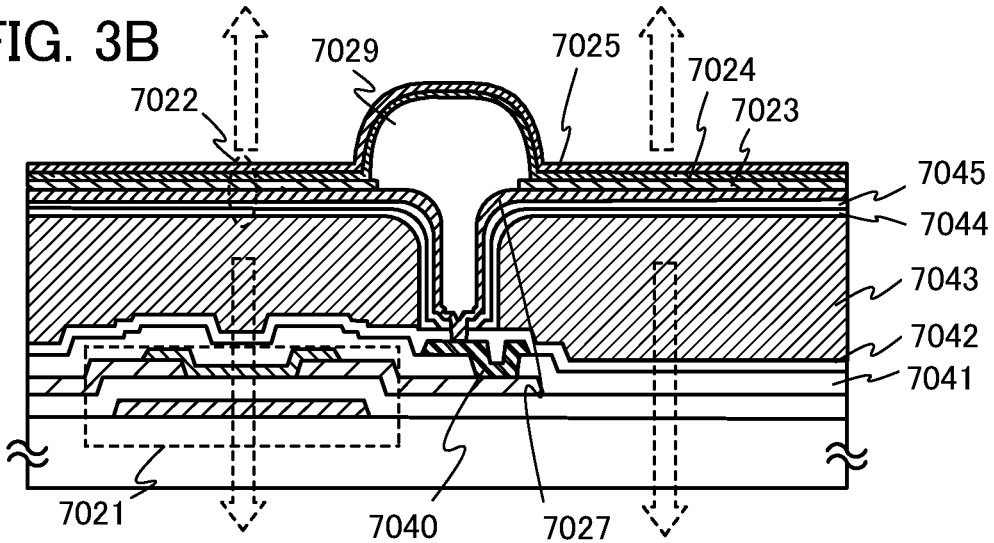
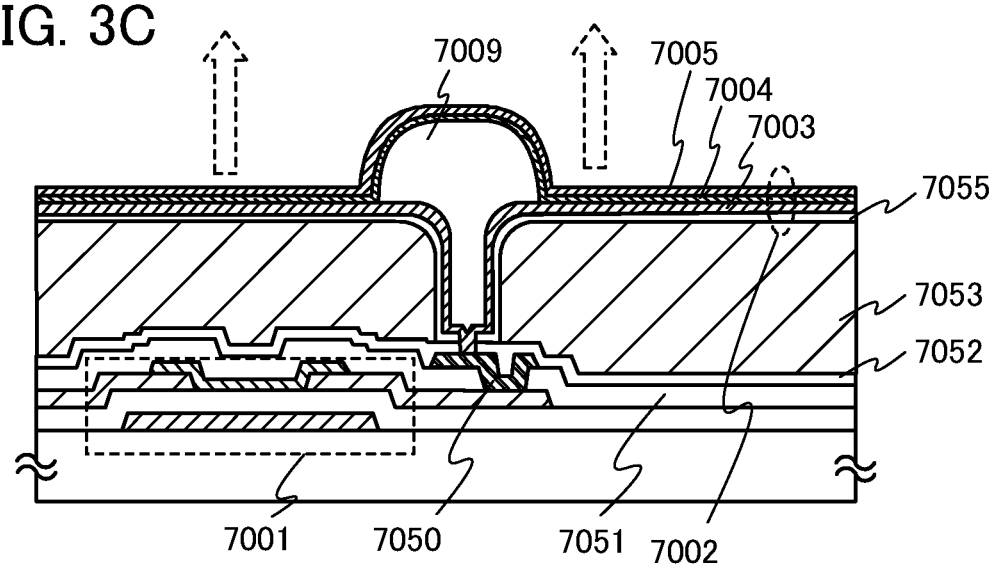

FIG. 5A1
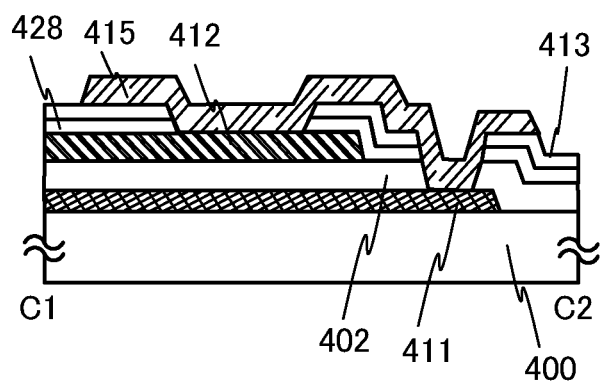
FIG. 5A2
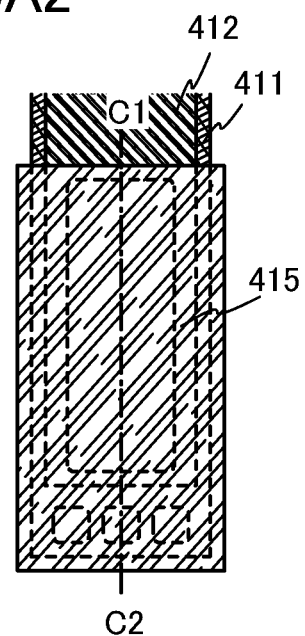
FIG. 5B1
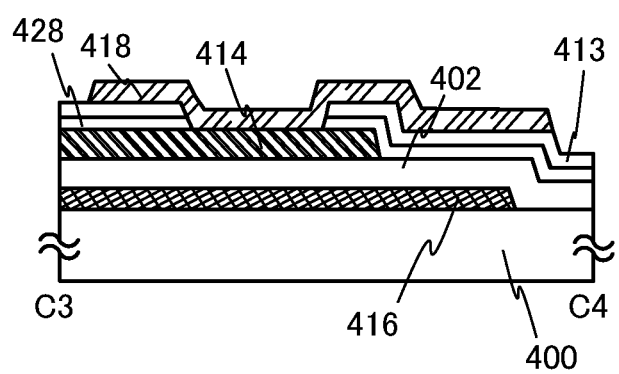
FIG. 5B2
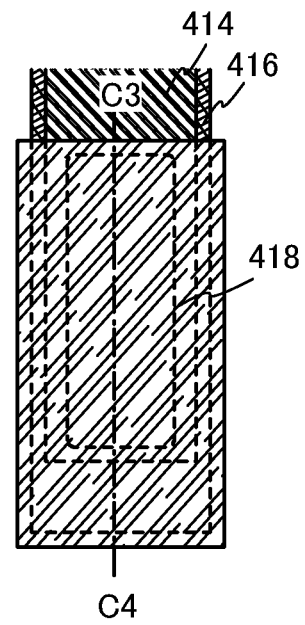

LIGHT-EMITTING DEVICE AND MANUFACTURING METHOD THEREOF

BACKGROUND OF THE INVENTION

1. Field of the Invention

The present invention relates to a light-emitting device including a layer containing an organic compound as a light-emitting layer, and a manufacturing method of the light-emitting device. For example, the present invention relates to an electronic device in which a light-emitting display device having an organic light-emitting element is mounted.

2. Description of the Related Art

A light-emitting element containing an organic compound as a luminous body, which has features such as thinness, lightness, high-speed response, and DC drive at a low voltage, is expected to be applied to a next-generation flat panel display or a next-generation lighting device. In particular, a display device in which light-emitting elements are arranged in matrix is considered to have advantages in a wide viewing angle and excellent visibility over a conventional liquid crystal display device.

It is said that, as for a light-emitting mechanism of a light-emitting element, an EL layer is interposed between a pair of electrodes and voltage is applied to the EL layer, so that electrons injected from a cathode and holes injected from an anode are recombined in an emission center of the EL layer to form molecular excitons, and the molecular excitons release energy when returning to a ground state, whereby light is emitted. Singlet excitation and triplet excitation are known as excited states, and light emission can probably be achieved through either of the excited states.

An EL layer included in a light-emitting element includes at least a light-emitting layer. In addition, the EL layer can have a stacked-layer structure including a hole-injection layer, a hole-transport layer, an electron-transport layer, an electron-injection layer, and/or the like, in addition to the light-emitting layer.

As a material having semiconductor characteristics, metal oxide has attracted attention. The examples of such metal oxides having semiconductor characteristics are tungsten oxide, tin oxide, indium oxide, zinc oxide, and the like. A thin film transistor in which a channel formation region is formed using such metal oxide having semiconductor characteristics is known (for example, see Patent Documents 1 and 2).

A TFT applying an oxide semiconductor has high field effect mobility. Therefore, a driver circuit such as a display device can be formed using the TFT.

REFERENCE

[Patent Document 1] Japanese Published Patent Application No. 2007-123861
[Patent Document 2] Japanese Published Patent Application No. 2007-096055

SUMMARY OF THE INVENTION

In the case of providing a plurality of different circuits over an insulating surface, for example, when a pixel portion and a driver circuit are provided over one substrate, a thin film transistor for a pixel portion is required to have a higher switching property like a high on/off ratio, and a thin film transistor for a driver circuit is required to have a high response speed. In particular, the more the definition of a display devise is improved, the shorter the writing time of an image is. Therefore, it is preferable that a thin film transistor for a driver circuit have a high response speed.

It is an object of the present invention to form plural kinds of circuits over one substrate, and to provide a light-emitting device including plural kinds of thin film transistors in accordance with characteristics of the plural kinds of circuits.

An object of an embodiment of the present invention is to manufacture a light-emitting device with high reliability, using a thin film transistor with better electric characteristics and high reliability as a switching element.

An embodiment of the present invention is a light-emitting device in which: a driver circuit portion and a display portion (also called a pixel portion) are formed over one substrate; the driver circuit portion includes a thin film transistor for a driver circuit, in which a gate electrode layer, a source electrode layer, and a drain electrode layer are formed using a metal conductive film and a channel layer is formed using an oxide semiconductor, and a wiring for a driver circuit, formed using a metal conductive film; and the display portion includes a thin film transistor for a pixel, in which a source electrode layer and a drain electrode layer are formed using an oxide conductor and a semiconductor layer is formed using an oxide semiconductor.

As the thin film transistor for a pixel and the thin film transistor for a driver circuit, bottom-gate thin film transistors are used. The thin film transistor for a pixel is an inverted-coplanar (also called a bottom-contact) thin film transistor including an oxide semiconductor layer which overlaps a source and drain electrode layers.

Light-emitting elements emitting light with a plurality of colors and thin film transistors for pixels, which are electrically connected to the light-emitting elements may be formed over one substrate, so that a light-emitting device such as a display can be manufactured.

A plurality of light-emitting elements emitting white light may be provided and an optical film, specifically color filters may be provided so as to overlap light-emitting regions of the light-emitting elements, so that a light-emitting device with full colors can be manufactured. In the case where a color filter is provided between the light-emitting element emitting white light and the thin film transistor for a pixel so that display is performed by light emission passing through the color filter from the light-emitting element, a conductive film having a light-transmitting property may be used as materials of a gate electrode layer, a source electrode layer, and a drain electrode layer of the thin film transistor for a pixel, by which the aperture ratio can be improved. In this specification, the color filter refers not to a whole of a film including color filter layers with three colors (e.g., a red color filter, a blue color filter, and a green color filter) in addition to a black matrix and/or an overcoat but to a color filter with one color.

The thin film transistor for a driver circuit has a structure different from that of the thin film transistor for a pixel; the thin film transistor for a driver circuit is a bottom-gate thin film transistor in which an oxide insulating layer is provided so as to be in contact with an oxide semiconductor layer exposed between the source and drain electrode layers.

In the thin film transistor for a driver circuit, a drain electrode layer which is formed using a metal conductive film of Ti or the like is included and a high-resistance drain region (also called an HRD region) which is of an oxygen-depleted type is formed to be in contact with part of the top surface of the oxide semiconductor layer and overlaps the drain electrode layer. Specifically, the carrier concentration of the high-resistance drain region is greater than or equal to $1\times10^{18}/cm^3$ and is greater than the carrier concentration of a channel formation region (less than $1\times10^{18}/cm^3$). The carrier concentration in this specification means the carrier concentration obtained from Hall effect measurement at room temperature.

Further, a high-resistance source region (also called an HRS region) which is of an oxygen-depleted type is formed to be in contact with part of the top surface of the oxide semiconductor layer and overlaps the source electrode layer.

One embodiment of the present invention is a light-emitting device in which: a pixel portion including a first thin film transistor and a driver circuit including a second thin film transistor having a structure different from that of the first thin film transistor are formed over one substrate; the first thin film transistor includes a gate electrode layer over the substrate, a gate insulating layer over the gate electrode layer, a source and drain electrode layers over the gate insulating layer, an oxide semiconductor layer which overlaps the source and drain electrode layers over the gate insulating layer, an oxide insulating layer which is in contact with the oxide semiconductor layer, a connection electrode layer which is electrically connected to the drain electrode layer over the oxide insulating layer, a color filter layer over the oxide insulating layer, and a first electrode which is electrically connected to the connection electrode layer over the color filter layer; a light-emitting layer is formed over the first electrode and a second electrode is formed over the light-emitting layer; and the gate electrode layer, the gate insulating layer, the oxide semiconductor layer, the source and drain electrode layers, the oxide insulating layer, and the first electrode of the first thin film transistor each have a light-transmitting property.

With the above structure, at least one of the above problems can be resolved.

In the above structure, as the connection electrode layer, a film including an element selected from Al, Cr, Cu, Ta, Ti, Mo, and W as its main component or a stacked-layer film including the film and an alloy film of any of the elements is used. In addition, the source and drain electrode layers of the first thin film transistor are formed using indium oxide, an alloy of indium oxide and tin oxide, an alloy of indium oxide and zinc oxide, or zinc oxide.

A source and drain electrode layers of the second thin film transistor that is a thin film transistor for a driver circuit are formed using a material which is the same as that of the connection electrode layer; an element selected from Ti, Mo, W, Al, Cr, Cu, and Ta, an alloy containing any of the above elements as its component, an alloy containing a combination of any of the above elements, or the like is used. The source and drain electrode layers are not necessarily single layers containing the above-described element and may be stacked layers of two or more layers.

The source and drain electrode layers of the second thin film transistor do not overlap a channel formation region of an oxide semiconductor layer. Further, the distance between a side surface of the source electrode layer and a side surface of the drain electrode layer, which faces the side surface of the source electrode layer is larger than the width of an oxide insulating film which functions as a channel protective layer. In order for high-speed operation of the thin film transistor for a driver circuit, the width of the oxide insulating layer which functions as a channel protective layer (width in the channel length direction) is designed to be small, which leads to reduction in the distance between the side surface of the source electrode layer and the side surface of the drain electrode layer, which faces the side surface of the source electrode layer, so that the source electrode layer and the drain electrode layer may be short-circuited; therefore, it is useful to increase the distance therebetween. The integration degree of a circuit can be increased by using a thin film transistor capable of high-speed operation.

Further, in the above structure, the second thin film transistor includes the oxide semiconductor layer, the oxide insulating layer is provided over the oxide semiconductor layer, and the channel formation region of the oxide semiconductor layer and the outer edge of the oxide semiconductor layer are in contact with the oxide insulating layer. The oxide insulating layer on and in contact with the channel formation region of the oxide semiconductor layer serves as the channel protective layer.

In the above structure, as the oxide insulating layer which serves as the channel protective layer of the thin film transistor for a driver circuit, an inorganic insulating film formed by a sputtering method is used; typically, a silicon oxide film, a silicon nitride oxide film, an aluminum oxide film, an aluminum oxynitride film, or the like is used.

In the second thin film transistor, an oxide conductive layer may be each provided between the oxide semiconductor layer and the source electrode layer and between the oxide semiconductor layer and the drain electrode layer, by which the contact resistance can be decreased, so that a thin film transistor capable of high-speed operation can be realized. It is preferable that the oxide conductive layer contain zinc oxide as its component but do not contain indium oxide. As materials of such an oxide conductive layer, zinc oxide, zinc aluminum oxide, zinc aluminum oxynitride, zinc gallium oxide, and the like can be given.

The oxide semiconductor layer of the thin film transistor for a driver circuit includes a third region which overlaps neither the oxide insulating layer nor the source and drain electrode layers over the oxide semiconductor layer. The width in the channel length direction of the third region is determined by patterning positions of the oxide semiconductor layer and the source and drain electrode layers. As the width in the channel length direction of the third region is increased, the off-current of the thin film transistor for a driver circuit can be decreased. As the width in the channel length direction of the third region is decreased, the operation speed of the thin film transistor for a driver circuit can be increased.

Further, as an insulating layer which is in contact with the third region, an inorganic insulating film is used; typically, a silicon nitride film, a silicon nitride oxide film, an aluminum nitride film, or the like is used.

As the oxide semiconductor layer, a thin film expressed by $InMO_3(ZnO)_m$ (m>0) is formed, and a thin film transistor using the thin film as an oxide semiconductor layer is manufactured. Note that M denotes one metal element or a plurality of metal elements selected from Ga, Fe, Ni, Mn, and Co. As an example, M may be Ga or may include the above metal element in addition to Ga, for example, M may be Ga and Ni or Ga and Fe. Moreover, in the above oxide semiconductor, in some cases, a transition metal element such as Fe or Ni or an oxide of the transition metal is contained as an impurity element in addition to a metal element contained as M. In this specification, an oxide semiconductor layer whose composition formula is expressed as $InMO_3(ZnO)_m$ (m>0) where Ga is included as M is referred to as an In—Ga—Zn—O-based oxide semiconductor, and a thin film thereof is also referred to as an In—Ga—Zn—O-based non-single-crystal film.

As other examples of the metal oxide applicable to the oxide semiconductor layer, any of the following metal oxides can be applied: an In—Sn—O-based metal oxide; an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. Silicon oxide may be included in the oxide semiconductor layer formed using the metal oxide.

One embodiment of the present invention is a method for manufacturing a light-emitting device, in which: a first gate electrode layer and a second gate electrode layer are formed over a substrate having an insulating surface; a gate insulating layer is formed over the first gate electrode layer and the second gate electrode layer; a first source and drain electrode layers are formed over the gate insulating layer so as to overlap the first gate electrode layer; over the gate insulating layer, a first oxide semiconductor layer is formed so as to overlap the first gate electrode layer, part of the first source electrode layer, and part of the first drain electrode layer, and a second oxide semiconductor layer is formed so as to overlap the second gate electrode layer; an oxide insulating layer is formed so as to be in contact with part of the second oxide semiconductor layer and with a top surface and a side surface of the second oxide semiconductor layer; a second source and drain electrode layers are formed over the second oxide semiconductor layer, and a connection electrode layer is formed over the oxide insulating layer so as to be electrically connected to the first drain electrode layer; a color filter layer is formed over the oxide insulating layer which overlaps the first oxide semiconductor layer; and over the color filter layer, a first electrode which is electrically connected to the connection electrode layer, a light-emitting layer, and a second electrode are formed.

In the above-described manufacturing method, the oxide insulating layer which is in contact with the first oxide semiconductor layer and the second oxide semiconductor layer is formed without exposure to air so as to prevent entry of impurities such as water or hydrogen into the oxide insulating layers after the oxide insulating layers are dehydrated or dehydrogenated.

The dehydration or dehydrogenation is performed by heat treatment in an inert gas atmosphere containing nitrogen or a rare gas (such as argon or helium) at a temperature higher than or equal to 400° C. and lower than a strain point of the substrate, whereby impurities such as moisture contained in the oxide semiconductor layer are reduced.

In the case where the heat treatment is performed in the inert gas atmosphere containing nitrogen or a rare gas (such as argon or helium) or under reduced pressure, the heat treatment may make an oxide semiconductor layer an oxygen-depleted type layer to reduce the resistance thereof, so that the oxide semiconductor layer is turned into an n-type (such as $n^-$-type) oxide semiconductor layer, and after that, the oxide insulating film which is in contact with the oxide semiconductor layer is formed, by which the oxide semiconductor layer is made to be in an oxygen-excess state so as to be a high-resistive, that is, i-type oxide semiconductor layer. Accordingly, a semiconductor device including a highly reliable thin film transistor having better electric characteristics can be manufactured and provided.

The dehydration or dehydrogenation of the oxide semiconductor layer is conducted under conditions of the heat treatment such that two peaks of water or at least a peak at around 300° C. are/is not detected when the dehydrated or dehydrogenated oxide semiconductor layer is measured with thermal desorption spectroscopy (TDS) while the temperature is increased to 450° C. Therefore, even when a thin film transistor using the dehydrated or dehydrogenated oxide semiconductor layer is subjected to TDS at a temperature as high as 450° C., at least the peak of water at around 300° C. is not detected.

After that, slow cooling is performed from the heat temperature T at which the oxide semiconductor layer is dehydrated or dehydrogenated to a temperature low enough to prevent entry of impurities such as water or hydrogen, specifically to a temperature which is lower than the heating temperature T by 100° C. It is important that the same furnace used for the dehydration or dehydrogenation is used without exposure to air and entry of impurities such as water or hydrogen is prevented. The dehydration or dehydrogenation are performed to make an oxide semiconductor layer a less-resistive type layer, that is, an n-type (such as $n^-$- or $n^+$-type) layer, and after that, the oxide semiconductor layer is made to be a high-resistive so as to be an i-type oxide semiconductor layer. In the case where a thin film transistor is manufactured using such an oxide semiconductor layer, the threshold voltage of the thin film transistor is positive and a so-called normally-off switching element can be obtained. It is preferable for a display device that a channel be formed with a threshold voltage that is a positive value as close to 0 V as possible. If the threshold voltage of the thin film transistor is negative, the thin film transistor tends to be a so-called normally-on TFT, in which current flows between the source electrode and the drain electrode even when the gate voltage is 0 V. In an active-matrix display device, electric characteristics of thin film transistors included in a circuit are important and affect the performance of the display device. Among the electric characteristics of thin film transistors, in particular, a threshold voltage (Vth) is important. When the threshold voltage value is high or a negative value even when the field effect mobility is high, it is difficult to control the circuit. When a thin film transistor has a high threshold voltage value with a large absolute value, the thin film transistor cannot perform switching function as a TFT and may be a load when the transistor is driven at low voltage. In the case of an n-channel thin film transistor, it is preferable that a channel is formed and drain current begins to flow after a positive voltage is applied as a gate voltage. A transistor in which a channel is not formed unless the driving voltage is high and a transistor in which a channel is formed and drain current flows even at a negative voltage are unsuitable for a thin film transistor used in a circuit.

A gas atmosphere in which the temperature is decreased from the heat temperature T may be switched to a gas atmosphere different from that in which the temperature is increased to the heat temperature T. For example, the slow cooling is performed in the same furnace as the furnace for the dehydration or dehydrogenation, which is filled with a high-purity oxygen gas or $N_2O$ gas, or an ultra dry air (with a dew point of −40° C. or less, preferably −60° C. or less) without exposure to air.

Using the oxide semiconductor film, which is formed by the heat treatment for dehydration or dehydrogenation so as to reduce moisture contained in the film and then the slow cooling (or cooling) in an atmosphere (with a dew point of −40° C. or less, preferably −60° C. or less) in which moisture is not contained, the electric characteristics of the thin film transistor is improved and mass productivity and high performance can be provided for the thin film transistor.

In this specification, heat treatment in an inert gas atmosphere of nitrogen or a rare gas (such as argon or helium) or under reduced pressure is referred to as heat treatment for dehydration or dehydrogenation. In this specification, dehydrogenation does not refer to only elimination in the form of $H_2$ by the heat treatment, and dehydration or dehydrogenation also refers to elimination of H, OH, and the like for convenience.

In the light-emitting display device including a light-emitting element, a plurality of thin film transistors are included in a pixel portion, and in the pixel portion, there is a region where a gate electrode of a thin film transistor is connected to a source wiring or a drain wiring of another thin film transistor. In addition, in a driver circuit of the light-emitting display device including a light-emitting element, there is a region where a gate electrode of the thin film transistor is connected to a source wiring or a drain wiring of the thin film transistor.

Since a thin film transistor is easily broken due to static electricity or the like, it is preferable that a protection circuit for protecting a thin film transistor included in the pixel portion be provided for a gate line or a source line, over the same substrate as a substrate for the pixel portion. It is preferable that the protection circuit be formed using a nonlinear element using an oxide semiconductor layer.

Note that the ordinal numbers such as "first" and "second" in this specification are used for convenience and do not denote the order of steps or the stacking order of layers. In addition, the ordinal numbers in this specification do not denote particular names which specify the present invention.

In the semiconductor device according to one embodiment of the present invention, a driver circuit portion including a TFT for a driver circuit and a display portion including a TFT for a pixel are manufactured over one substrate. Accordingly, the manufacturing cost of a light-emitting device can be reduced.

Further, according to one embodiment of the present invention, a light-emitting element which emits white light is formed over a substrate, so that a light-emitting device such as a lighting device can be manufactured. The lighting device is a lighting device using a light-emitting element which includes a layer containing a light-emitting substance with which electroluminescence (hereinafter referred to as EL) can be obtained.

An oxide semiconductor layer on which heat treatment for dehydration or dehydrogenation is performed is used, so that a highly reliable light-emitting device using a thin film transistor having better electric characteristics and high reliability can be manufactured. A light-emitting device in which a TFT for a pixel and a TFT for a driver circuit which have different structures in accordance with their circuits are provided over one substrate can be manufactured.

BRIEF DESCRIPTION OF THE DRAWINGS

FIGS. 1A to 1E are cross-sectional process views illustrating one embodiment of the present invention.

FIGS. 3A to 3C are cross-sectional views illustrating one embodiment of the present invention.

FIGS. 5A1 and 5B1 are cross-sectional views illustrating one embodiment of the present invention; and FIGS. 5A2 and 5B2 are plane views illustrating the one embodiment of the present invention.

DETAILED DESCRIPTION OF THE INVENTION

Figure 2:
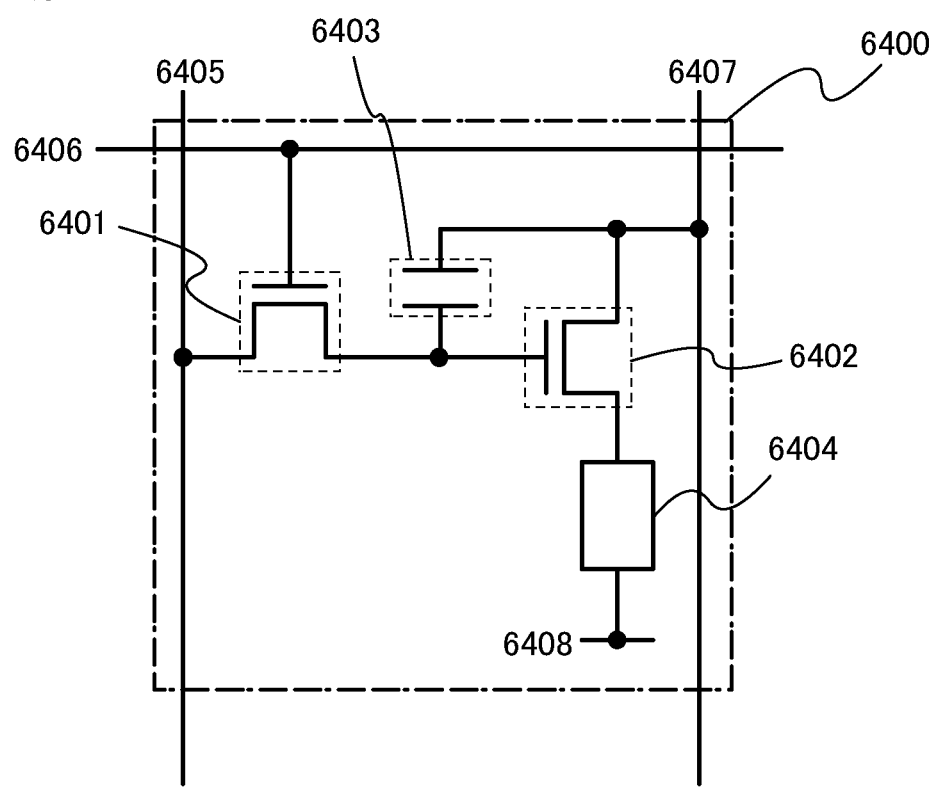
FIG. 2 is a circuit diagram illustrating one embodiment of the present invention.

Hereinafter, embodiments of the present invention will be described in detail with reference to the accompanying drawings. Note that the present invention is not limited to the description below, and it is easily understood by those skilled in the art that modes and details disclosed herein can be modified in various ways without departing from the spirit and scope of the present invention. Therefore, the present invention is not construed as being limited to description of the embodiments. In the drawings of this specification, the same portions or portions having the same function or a similar function are denoted by the same reference numerals, and description thereon may be omitted.

Embodiment 1

In Embodiment 1, one embodiment of a light-emitting device and a method for manufacturing the light-emitting device will be described with reference to FIGS. 1A to 1E. FIG. 1E illustrates an example of cross-sectional structures of two thin film transistors having different structures manufactured over one substrate.

A thin film transistor 450 shown in FIG. 1E is a bottom-gate type and a thin film transistor 460 is a bottom-gate type and is called a bottom-contact type (also referred to as an inverted-coplanar type).

The thin film transistor 460 included in a pixel is a bottom-contact thin film transistor which includes a gate electrode layer 451a, a gate insulating layer 402, an oxide semiconductor layer 454 including a channel formation region, a source electrode layer 455a, and a drain electrode layer 455b over a substrate 400 having an insulating surface. In addition, an oxide insulating layer 426b is provided so as to cover the thin film transistor 460 and be in contact with a top surface and a side surface of the oxide semiconductor layer 454.

Further, a single-gate thin film transistor is used as an example of the thin film transistor 460 for description; alternatively, a multi-gate thin film transistor including a plurality of channel formation regions can be used as needed.

The oxide semiconductor layer 454 is formed on the source electrode layer 455a and the drain electrode layer 455b and partly overlaps them. Further, the oxide semiconductor layer 454 overlaps the gate electrode layer 451a with the gate insulating layer 402 interposed therebetween. A channel formation region of the thin film transistor 460 included in a pixel is a region of the oxide semiconductor layer 454, between a side surface of the source electrode layer 455a and a side surface of the drain electrode layer 455b which face each other, that is, a region of the oxide semiconductor layer 454, which is in contact with the gate electrode layer 402 and overlaps the gate electrode layer 451a.

Further, in order to realize a light-emitting device with a high aperture ratio, using a thin film transistor having a light-transmitting property as the thin film transistor 460, a conductive film having a light-transmitting property is used as each of the source electrode layer 455a and the drain electrode layer 455b.

Further, the gate electrode layer 451a of the thin film transistor 460 is also formed using a conductive film having a light-transmitting property. In this specification, a film having a light-transmitting property to visible light refers to a film with a thickness which realizes a light transmittance to visible light of 75% to 100%, which is also referred to as a transparent conductive film in the case where the film has a conductive property. Alternatively, a conductive film which is semitransparent to visible light may be used. The expression "semi-transparent to visible light" refers to the property that the light transmittance to visible light is 50% to 75%

The thin film transistor 450 provided in a driver circuit includes a gate electrode layer 421a, the gate insulating layer 402, an oxide semiconductor layer including a channel formation region 423, a high-resistance source region 424a, and a high-resistance drain region 424b, a source electrode layer 425a, and a drain electrode layer 425b over the substrate 400 having the insulating surface. An oxide insulating layer 426a which is in contact with the channel formation region 423 is formed. An insulating layer 428 is provided over the source electrode layer 425a and the drain electrode layer 425b.

Further, a first region 424c and a second region 424d of the oxide semiconductor layer, which overlap the oxide insulating layer 426b are in an oxygen-excess state like the channel formation region 423; accordingly, the leak current can be reduced and the parasitic capacitance can be reduced. A third region 424e of the oxide semiconductor layer, which is in contact with the insulating layer 428 is provided between the channel formation region 423 and the high-resistance source region 424a. A fourth region 424f of the oxide semiconductor layer, which is in contact with the insulating layer 428 is provided between the channel formation region 423 and the high-resistance drain region 424b. The third region 424e and the fourth region 424f of the oxide semiconductor layer, which are in contact with the insulating layer 428, can reduce off-state current.

In a channel-protected thin film transistor, if the width of an oxide insulating layer is decreased in order to decrease the channel length L of a channel formation region and a source electrode layer and a drain electrode layer are provided over the oxide insulating layer having the decreased width of the oxide insulating layer, the electrode layers may be short-circuited over the oxide insulating layer. Therefore, in this embodiment, the source electrode layer 425a and the drain electrode layer 425b are provided such that the oxide insulating layer 426a with a decreased width does not overlap the source electrode layer 425a and the drain electrode layer 425b.

In FIG. 1E, a region of the oxide semiconductor layer, in which the oxide insulating layer 426a which functions as a channel protective layer and the gate electrode layer overlap each other with the gate insulating layer interposed therebetween is referred to as a channel formation region. Therefore, the channel length L of the thin film transistor 450 is equal to the width of the oxide insulating layer 426a in the channel length direction. Note that the channel length L of the thin film transistor 450 is a length in the interface between the oxide semiconductor layer and the oxide insulating layer 426a; that is, since the oxide insulating layer 426a is trapezoidal in the cross-sectional view of FIG. 1E, the channel length L of the thin film transistor 450 is a length of the base of the trapezoid.

The process for manufacturing the thin film transistors 450 and 460 over one substrate will be described with reference to FIGS. 1 to 1E below.

First, a conductive film is formed over the substrate 400 having an insulating surface and a first photolithography step is performed thereon to form the gate electrode layers 421a and 421b.

A resist mask may be formed by an inkjet method; in that case, the manufacturing cost can be reduced because a photomask is not used.

As a material of each conductive film of the gate electrode layers 421a and 421b, the following can be used: an element selected from Al, Cr, Ta, Ti, Mo, and W, an alloy including the above element as its component, an alloy film including any of these elements in combination, or the like.

Although there is no particular limitation on a substrate which can be used as the substrate 400 having an insulating surface, it is necessary that the substrate have at least enough heat resistance to a heat treatment to be performed later. A glass substrate can be used as the substrate 400 having an insulating surface.

In the case where a glass substrate is used and the temperature at which the heat treatment is performed later is high, it is preferable to use a glass substrate whose strain point is greater than or equal to 730° C. As a glass substrate, a glass material such as aluminosilicate glass, aluminoborosilicate glass, or barium borosilicate glass is used, for example. When a larger amount of barium oxide (BaO) than boric acid is contained, a glass substrate is heat-resistant and of more practical use. Therefore, it is preferable that a glass substrate containing BaO and $B_2O_3$ so that the amount of BaO is larger than that of $B_2O_3$ be used.

Note that a substrate formed using an insulator such as a ceramic substrate, a quartz substrate, or a sapphire substrate may be used instead of the glass substrate. Crystallized glass or the like may be used as well.

An insulating film serving as a base film may be provided between the substrate 400 and the gate electrode layers 421a and 421b. The base film has a function of preventing diffusion of an impurity element from the substrate 400, and can be formed using a single layer or stacked layers using one or more of a silicon nitride film, a silicon oxide film, a silicon nitride oxide film, and a silicon oxynitride film.

Next, a conductive film having light-transmitting property is formed so as to cover the gate electrode layers 421a and 421b and a second photolithography step is performed thereon to form the gate electrode layer 451a and a gate electrode layer 451b. In this embodiment, in order to reduce the wiring resistance, a gate wiring provided in a pixel portion is formed using the same conductive film as the gate electrode layer 421b, and a conductive film having a light-transmitting property is used as a material of the gate electrode layer 451a which overlaps the oxide semiconductor layer formed later with the gate insulating layer 402 interposed therebetween.

Next, the gate insulating layer 402 is formed over the gate electrode layers 421a, 421b, 451a, and 451b.

The gate insulating layer 402 can be formed using a single layer or stacked layers using one or more of a silicon oxide layer, a silicon nitride layer, a silicon oxynitride layer, and a silicon nitride oxide layer by a plasma CVD method, a sputtering method, or the like. For example, a silicon oxynitride layer may be formed by a plasma CVD method using $SiH_4$, oxygen, and nitrogen as a film formation gas. The thickness of the gate insulating layer 402 is greater than or equal to 100 nm and less than or equal to 500 nm; in the case where the gate insulating layer 402 is formed using stacked layers, for example, a first gate insulating layer with a thickness greater than or equal to 50 nm and less than or equal to 200 nm and a second gate insulating layer with a thickness greater than or equal to 5 nm and less than or equal to 300 nm are stacked.

In this embodiment, the gate insulating layer 402 is a silicon oxynitride (SiON (composition ratio: N<O)) layer with a thickness of 100 nm formed by a plasma CVD method.

Next, a light-transmitting conductive film is formed over the gate insulating layer 402, and then a third photolithography step is performed thereon, so that the source electrode layer 455a and the drain electrode layer 455b are formed (see FIG. 1A). As a material of the light-transmitting conductive film, a conductive material that transmits visible light, for example, an In—Sn—O-based metal oxide, an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, or a Zn—O-based metal oxide can be employed, and the film thickness thereof is selected in the range of 50 nm to 300 nm both inclusive. When a sputtering method is employed, it is preferable that film deposition be performed using a target containing $SiO_2$ of 2 to 10 percent by weight so that $SiO_x$ (x>0) which inhibits crystallization be contained in the light-transmitting conductive film, thereby preventing crystallization at the time of heat treatment for dehydration or dehydrogenation in a later step.

In this embodiment, it is preferable that an oxide semiconductor be an oxide semiconductor containing In, more preferably an oxide semiconductor containing In and Ga. In order to obtain an I-type (intrinsic) oxide semiconductor layer, dehydration or dehydrogenation are effective.

Next, the gate insulating layer 402 is selectively etched by a fourth photolithography step, so that a contact hole reaching the gate electrode layer 421b is formed.

An oxide semiconductor film with a thickness of 5 nm or more and 200 nm or less, preferably 10 nm or more and 20 nm or less is formed over the gate insulating layer 402. The thickness is preferably as thin as 50 nm or less in order that the oxide semiconductor film keeps the amorphous state even when heat treatment for dehydration or dehydrogenation is performed after the formation of the oxide semiconductor film. The thickness of the oxide semiconductor film as thin as possible can suppress crystallization when heat treatment is performed after the oxide semiconductor layer is formed.

The following can be used as the oxide semiconductor film: an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, an Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. The oxide semiconductor film can be formed by a sputtering method under a rare gas (typically argon) atmosphere, an oxygen atmosphere, or an atmosphere including a rare gas (typically argon) and oxygen. When a sputtering method is employed, it is preferable that film deposition be performed using a target containing $SiO_2$ of 2 to 10 percent by weight so that $SiO_x$ (x>0) which inhibits crystallization be contained in the light-transmitting conductive film, thereby preventing crystallization at the time of heat treatment for dehydration or dehydrogenation in a later step.

In this embodiment, film deposition is performed using an oxide semiconductor target including In, Ga, and Zn ($In_2O_3$:$Ga_2O_3$:ZnO=1:1:1 [mol ratio]) under the following condition: the distance between a substrate and a target is 100 mm, the pressure is 0.6 Pa, the direct-current (DC) power supply is 0.5 kW, and the atmosphere is oxygen (the flow rate of oxygen is 100%). It is preferable that a pulsed direct-current (DC) power supply be used because dust can be reduced and the film thickness can be uniform. In this embodiment, as the oxide semiconductor film, a 15-nm-thick In—Ga—Zn—O-based non-single-crystal film is formed by a sputtering method using an In—Ga—Zn—O-based oxide semiconductor target.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal conductive film.

A multi-source sputtering apparatus in which a plurality of targets of different materials can be set can be used. With the multi-source sputtering apparatus, films of different materials can be formed to be stacked in the same chamber, or a film of plural kinds of materials can be formed by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge can be used.

As the deposition method using a sputtering method, a reactive sputtering method in which a target substance and a sputtering gas component are chemically reacted with each other during deposition to form a thin film of a compound thereof, or a bias sputtering method in which a voltage is also applied to a substrate during deposition can be used.

It is preferable that before the oxide semiconductor film is formed by a sputtering method, dust on a surface of the gate insulating layer 402 be removed by reverse sputtering in which an argon gas is introduced and plasma is generated. The reverse sputtering refers to a method in which, without application of a voltage to a target side, an RF power source is used for application of a voltage to a substrate side in an argon atmosphere so that plasma is formed near the substrate to modify a surface. Note that instead of an argon atmosphere, nitrogen, helium, oxygen, or the like may be used.

In this embodiment, the gate insulating layer is selectively etched by the fourth photolithography step to form the contact hole reaching the gate electrode layer 421b; however, the present invention is not particularly limited thereto. A contact hole reaching the gate electrode layer 421b may be formed with a resist mask formed on an oxide semiconductor layer after the oxide semiconductor layer is etched; in that case, it is preferable that reverse sputtering be performed to remove resist residue or the like attached on the surface of the oxide semiconductor layer and the gate insulating layer 402.

Alternatively, the following may be performed; an oxide semiconductor film is formed on the gate insulating layer, a resist mask is formed on the oxide semiconductor film, a contact hole reaching the gate electrode layer 421b is formed, and then, the resist mask is removed, and after that, a resist mask is formed again on the oxide semiconductor film, and the oxide semiconductor film is selectively etched to be an island-shaped oxide semiconductor layer.

Further, before the oxide semiconductor film is formed, heat treatment (at greater than or equal to 400° C. and less than the strain point of the substrate) may be performed in an inert gas atmosphere (nitrogen, or helium, neon, argon, or the like), thereby removing impurities such as hydrogen and water contained in the gate insulating layer.

In this embodiment, the contact hole reaching the gate electrode layer 421b is formed by selectively etching the gate insulating layer by the fourth photolithography step; therefore, it is preferable that the oxide semiconductor film be formed after heat treatment (at greater than or equal to 400° C. and less than the strain point of the substrate) may be performed in an inert gas atmosphere (nitrogen, or helium, neon, argon, or the like) to remove impurities such as hydrogen and water contained in the layer.

Then, the oxide semiconductor film is processed into island-shaped oxide semiconductor layers by a fifth photolithography step. A resist mask used for forming the island-shaped semiconductor layers may be formed by an inkjet method. Formation of the resist mask by an inkjet method does not need a photomask, by which the manufacturing cost can be reduced.

Next, dehydration or dehydrogenation of the oxide semiconductor layer is performed. First heat treatment for dehydration or dehydrogenation is performed at a temperature greater than or equal to 400° C. and less than the strain point of the substrate, preferably 425° C. or more. In the case where the temperature is 425° C. or more, the heat treatment time may be one hour or less, whereas in the case where the temperature is less than 425° C., the heat treatment time is longer than one hour. In this embodiment, the substrate is introduced into an electric furnace which is one of heat treatment apparatuses, the heat treatment of the oxide semiconductor layer is performed in a nitrogen atmosphere, and after that, the oxide semiconductor layer is not exposed to air, which prevents impurities such as water or hydrogen from entering the oxide semiconductor layer; thus, an oxide semiconductor layer is obtained. In this embodiment, one furnace is used up to the time when the temperature is lowered from the heat temperature T at which the dehydration or dehydrogenation of the oxide semiconductor layer is performed to the temperature enough to prevent entrance of water. Specifically, slow cooling is performed in a nitrogen atmosphere up to the time when the temperature becomes less than the heat temperature T by 100° C. or more. Without being limited to a nitrogen atmosphere, the dehydration or dehydrogenation may be performed in another rare gas atmosphere such as helium, neon, or argon.

In the first heat treatment, it is preferable that water, hydrogen, and the like be not contained in nitrogen or a rare gas such as helium, neon, or argon. The purity of nitrogen or a rare gas such as helium, neon, or argon which is introduced into the heat treatment apparatus is preferably 6N (99.9999%) or more, more preferably 7N (99.99999%) or more (i.e., the concentration of impurities is preferably 1 ppm or less, more preferably 0.1 ppm or less).

Further, the oxide semiconductor film may be crystallized to be a micro crystal film or a polycrystalline film depending on a condition of the first heat treatment, a material of the oxide semiconductor layer, or materials of the gate electrode layers 451a and 451b. After the first heat treatment, oxide semiconductor layers 403 and 453 which are oxygen-depleted type to have low resistance are obtained (see FIG. 1B). The carrier concentration is higher after the first heat treatment than that of the oxide semiconductor film just after the deposition; it is preferable that the oxide semiconductor layers 403 and 453 each have a carrier concentration of $1\times10^{18}/cm^3$ or more. For example, in the case where films of an alloy of indium oxide and tin oxide are used as the gate electrode layers 451a and 451b, they are crystallized by the first heat treatment at 450° C. for one hour, whereas in the case where films of an alloy of indium oxide and tin oxide containing silicon oxide are used as the gate electrode layers 451a and 451b, they are not crystallized.

The first heat treatment of the oxide semiconductor layer may be performed on the oxide semiconductor film before the oxide semiconductor film is processed into the island-shaped oxide semiconductor layers. In that case, after the first heat treatment, the substrate is taken out of the heating apparatus and subjected to a fifth photolithography step.

Next, an oxide insulating film is formed over the gate insulating layer 402 and the oxide semiconductor layers 403 and 453 by a sputtering method. Then, a resist mask is formed by a sixth photolithography step, and etching is selectively performed thereon to form the oxide insulating layers 426a and 426b. After that, the resist mask is removed. At this stage, in the oxide semiconductor layer, there are regions in contact with the oxide insulating layers. Among these regions, the region that overlaps the oxide insulating layer 426a, the gate electrode layer and the gate insulating layer is a channel formation region. There is also the region that overlaps the oxide insulating layer 426b covering the peripheral portion and side surface of the oxide semiconductor layer. By the sixth photolithography, a contact hole reaching the gate insulating layer 421b and a contact hole reaching the drain electrode layer 455b are also formed.

The oxide insulating film can be formed to a thickness at least 1 nm or more by a method by which impurities such as water and hydrogen are not mixed into the oxide insulating film, such as a sputtering method, as appropriate. In this embodiment, a silicon oxide film is formed by a sputtering method, as the oxide insulating film. The substrate temperature in the film deposition may be greater than or equal to room temperature and less than or equal to 300° C.; in this embodiment, the substrate temperature is 100° C. The deposition of the silicon oxide film by a sputtering method can be performed in a rare gas (typically, argon) atmosphere, an oxygen atmosphere, or an atmosphere of a rare gas (typically, argon) and oxygen. As a target, a silicon oxide target or a silicon target can be used. For example, with use of a silicon target, a silicon oxide film can be formed by a sputtering method in an atmosphere of oxygen and a rare gas. As the oxide insulating film formed in contact with the oxide semiconductor layer whose resistance is reduced, an inorganic insulating film that does not include impurities such as moisture, a hydrogen ion, and $OH^-$ and blocks entry of these from the outside may be used. Typically, a silicon oxide film, a silicon nitride oxide film, an aluminum oxide film, an aluminum oxynitride film, or the like is used.

In this embodiment, the film deposition is performed by a pulsed DC sputtering method using a columnar polycrystalline, boron-doped silicon target which has a purity of 6N (the resistance is 0.01 Ωcm), in which the distance between substrate and target (T-S distance) is 89 mm, the pressure is 0.4 Pa, the direct-current (DC) power source is 6 kW, and the atmosphere is oxygen (the oxygen flow rate is 100%). The film thickness thereof is 300 nm.

Next, second heat treatment (preferably at a temperature greater than or equal to 200° C. and less than or equal to 400° C., for example at a temperature greater than or equal to 250° C. and less than or equal to 350° C.) is performed under an inert gas atmosphere or a nitrogen gas atmosphere (see FIG. 1C). For example, second heat treatment under a nitrogen atmosphere at 250° C. for one hour is performed. According to the second heat treatment, heat is applied while the oxide insulating layer is in contact with an end portion of the oxide semiconductor layer 403, which overlaps the oxide insulating layer 426b and with a part of the oxide semiconductor layer 442, which overlaps the oxide insulating layer 426a. Further, according to the second heat treatment, heat is applied while the other part of the oxide semiconductor layers which do not overlap the oxide insulating layers is exposed. When heat treatment is performed in a nitrogen atmosphere or an inert gas atmosphere where the oxide semiconductor layer 403 is exposed, the resistance can be reduced in the high-resistance (I-type) region which is exposed in the oxide semiconductor layer. The oxide insulating layer 426a is provided above and in contact with the channel formation region of the oxide semiconductor layer 442, and functions as a channel protective layer.

The timing for performing the second heat treatment is not limited to the timing just after the sixth photolithography step as long as it is after the sixth photolithography step.

Next, a conductive film is formed over the gate insulating layer 402, the oxide insulating layers 426a and 426b, and the oxide semiconductor layers, a resist mask is formed by a seventh photolithography step, and etching is selectively performed thereon, so that the source electrode layer 425a and the drain electrode layer 425b are formed (see FIG. 1D). In addition, as shown in FIG. 1D, a connection electrode layer 429 which is electrically connected to the gate electrode layer 421b and a connection electrode layer 452 which is electrically connected to the drain electrode layer 455b are formed. As a film formation method of the conductive film, a sputtering method, a vacuum evaporation method (electron beam evaporation method or the like), an arc discharge ion plating method, or a spray method is employed. As a material of the conductive film, an element selected from Ti, Mo, W, Al, Cr, Cu, and Ta, an alloy containing any of these elements as a component, an alloy containing these elements in combination, or the like is used. The conductive film is not limited to a single layer containing the above-described element and may be two or more layers. In this embodiment, a three-layer conductive film in which a titanium film (with a thickness of 100 nm), an aluminum film (with a thickness of 200 nm), and a titanium film (with a thickness of 100 nm) are stacked is formed. Instead of the titanium film, a titanium nitride film may be used.

In the seventh photolithography step, only portions of the conductive film which are above and in contact with the oxide semiconductor layer are removed. Therefore, by using an ammonia peroxide mixture (hydrogen peroxide water: ammonia water:water=5:2:2), or the like as an alkaline etchant, the conductive film can be selectively removed to leave the oxide semiconductor layers including an In—Ga—Zn—O-based oxide semiconductor.

The resist mask used for forming the source electrode layer 425a and the drain electrode layer 425b may be formed by an inkjet method. Formation of the resist mask by an inkjet method does not need a photomask, by which the manufacturing cost can be reduced.

Next, the insulating layer 428 is formed over the oxide insulating layers 426a and 426b, the source electrode layer 425a, the drain electrode layer 425b, the connection electrode layer 429, and the connection electrode layer 452 (see FIG. 1E). As the insulating layer 428, a silicon nitride film, a silicon nitride oxide film, an aluminum nitride film, or the like is used. In this embodiment, the insulating layer 428 is formed using a silicon nitride film by an RF sputtering method.

Through the above process, two kinds of thin film transistors, the channel protective thin film transistor 450 and the bottom-contact type thin film transistor 460, can be manufactured over one substrate.

As the channel protective thin film transistor 450, the width of the oxide insulating layer is decreased such that the channel length L of the channel formation region becomes as short as a length greater than or equal to 0.1 μm and less than or equal to 2 μm, whereby a thin film transistor having high operation speed is achieved. As the bottom-contact type thin film transistor 460, a thin film transistor in which the channel length is longer than that of the channel protective thin film transistor 450 such that the off current is decreased is achieved. Further, the bottom-contact type thin film transistor 460 is structured by materials having light-transmitting property except for the connection electrode layer 452.

In the case where a light-emitting device is manufactured, a plurality of thin film transistors is provided in one pixel. For example, a driving TFT which is electrically connected to a light-emitting element has a channel length L of 55 μm and a channel width W of 20 μm, and a selecting TFT which is electrically connected to the gate electrode layer of the driving TFT has a channel length L of 25 μm and a channel width W of 60 μm. The width where the source electrode layer overlaps the gate electrode layer in the channel length direction is 5 μm, and the width where the drain electrode layer overlaps the gate electrode layer in the channel length direction is 5 μm. The structure of the bottom-contact type thin film transistor 460 is used for the driving TFT and a selecting TFT.

Further, in the case where a light-emitting device is manufactured, a power source supply line which is electrically connected to the source electrode layer of the driving TFT is provided. The power source supply line intersects with a gate wiring and is formed using the same material by the same step as the connection electrode layer 429 formed using a conductive film; alternatively, the power source supply line intersects with a source wiring and is formed using the same material by the same step as the gate electrode layer 421b.

Further, in the case where a light-emitting device is manufactured, one electrode of the light-emitting element is electrically connected to the drain electrode layer of the driving TFT, and a common potential line which is electrically connected to the other electrode of the light-emitting element is provided. The common potential line is formed using the same material by the same step as the connection electrode layer 429 formed using a conductive film; alternatively, the common potential line is formed using the same material by the same step as the gate electrode layer 421b.

Further, in the case where a light-emitting device is manufactured, a plurality of thin film transistors is provided in one pixel, and a connection portion which connects the gate electrode layer of one thin film transistor to the drain electrode layer of the other thin film transistor is provided. This connection portion is formed by the same step as the connection electrode layer 429 which is electrically connected to the gate electrode layer 421b.

Further, in the case where a driver circuit is formed over the same substrate, for example, the channel protective thin film transistor 450 is used, in which the channel length L is 2 μm and the channel width W is 50 μm. The widths of a third region and a fourth region in the channel length direction each are 2 μm. The width where the source electrode layer overlaps the gate electrode layer in the channel length direction is 2 μm, and the width where the drain electrode layer overlaps the gate electrode layer in the channel length direction is 2 μm.

A plurality of kinds of circuits, a driver circuit and a pixel portion in this embodiment, is formed over one substrate, and either of the channel protective thin film transistor 450 or the bottom-contact type thin film transistor 460 is used in accordance with respective characteristics of the driver circuit and the pixel portion, thereby achieving optimization.

Embodiment 2

In Embodiment 2, an example of manufacturing an active matrix light-emitting display device using the plurality of thin film transistors described in Embodiment 1 and a light-emitting element using electroluminescence will be described.

Light-emitting elements using electroluminescence are classified according to whether a light-emitting material is an organic compound or an inorganic compound. In general, the former is referred to as an organic EL element, and the latter is referred to as an inorganic EL element.

In an organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to the ground state from the excited state, thereby emitting light. Owing to such a mechanism, this light-emitting element is called a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. In this embodiment, an organic EL element is used as a light-emitting element for description.

FIG. 2 illustrates an example of a pixel configuration to which digital time grayscale driving can be applied, as an example of a semiconductor device.

A configuration and operation of the pixel to which digital time grayscale driving can be applied are described. In this embodiment, one pixel includes two n-channel transistors each of which includes a channel formation region using an oxide semiconductor layer.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 via the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential satisfying the low power supply potential<a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. In view of the above, each potential is set so that the potential difference between the high power supply potential and the low power supply potential is a forward threshold voltage or higher of the light-emitting element 6404.

The capacitor 6403 can be omitted by alternatively using the gate capacitance of the driving transistor 6402. The gate capacitance of the driving transistor 6402 may be formed between the channel region and the gate electrode.

In the case of a voltage-input voltage driving method, a video signal is input to the gate of the driving transistor 6402 so that the driving transistor 6402 is in either of two states of being sufficiently turned on or turned off. That is, the driving transistor 6402 operates in a linear region. Since the driving transistor 6402 operates in the linear region, a voltage higher than the voltage of the power supply line 6407 is applied to the gate of the driving transistor 6402. A voltage higher than or equal to (voltage of the power supply line+Vth of the driving transistor 6402) is applied to the signal line 6405.

In the case of performing analog grayscale driving instead of digital time grayscale driving, the same pixel configuration as FIG. 2 can be used by changing an input signal.

In the case of performing analog grayscale driving, a voltage higher than or equal to (forward voltage of the light-emitting element 6404+Vth of the driving transistor 6402) is applied to the gate of the driving transistor 6402. The forward voltage of the light-emitting element 6404 refers to a voltage at which a desired luminance is obtained, and includes at least a forward threshold voltage. A video signal by which the driving transistor 6402 operates in a saturation region is input, so that current can be supplied to the light-emitting element 6404. In order for the driving transistor 6402 to operate in the saturation region, the potential of the power supply line 6407 is set higher than the gate potential of the driving transistor 6402. When an analog video signal is used, it is possible to supply current to the light-emitting element 6404 in accordance with the video signal and perform analog grayscale driving.

The pixel configuration illustrated in FIG. 2 is not limited thereto. For example, a switch, a resistor, a capacitor, a transistor, a logic circuit, or the like may be added to the pixel illustrated in FIG. 2.

Next, structures of the light-emitting element are described with reference to FIGS. 3A to 3C. In this embodiment, a cross-sectional structure of a pixel will be described by taking an n-channel driving TFT as an example. Driving TFTs 7001, 7011, and 7021 used for semiconductor devices illustrated in FIGS. 3A, 3B, and 3C can be manufactured in a manner similar to that of the thin film transistor described in Embodiment 1 and are highly reliable thin film transistors each including an oxide semiconductor layer.

In order to extract light emitted from the light-emitting element, at least one of an anode and a cathode transmits light.

A thin film transistor and the light-emitting element are formed over a substrate. As structures of the light-emitting element, there are the following: a top emission structure in which light emission is extracted through the surface opposite to the substrate; a bottom emission structure in which light emission is extracted through the surface on the substrate side; and a dual emission structure in which light emission is extracted through the surface opposite to the substrate and the surface on the substrate side. The pixel configuration shown in FIG. 2 can be applied to a light-emitting element having any of these emission structures.

Next, a light-emitting element having a bottom emission structure will be described with reference to FIG. 3A.

FIG. 3A is a cross-sectional view of a pixel in the case where the driving TFT 7011 is an n-channel TFT and light is emitted from a light-emitting element 7012 to a cathode 7013 side. In FIG. 3A, the cathode 7013 of the light-emitting element 7012 is formed over a light-transmitting conductive film 7017 that is electrically connected to the driving TFT 7011 through a connection electrode layer 7030, and an EL layer 7014 and an anode 7015 are stacked in this order over the cathode 7013. The connection electrode layer 7030 is electrically connected to a drain electrode layer of the driving TFT 7011 through a contact hole formed in an oxide insulating layer 7031.

As the light-transmitting conductive film 7017, a light-transmitting conductive film such as a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added can be used.

The cathode 7013 can be formed using a variety of materials; it is preferable to use a material having a low work function, such as an alkali metal such as Li or Cs, an alkaline-earth metal such as Mg, Ca, or Sr, an alloy containing any of these (Mg:Ag, Al:Li, or the like), or a rare-earth metal such as Yb or Er. In FIG. 3A, the thickness of the cathode 7013 is a thickness that can transmit light (preferably, about 5 nm to 30 nm). For example, a 20-nm-thick aluminum film is used as the cathode 7013.

Note that the light-transmitting conductive film and the aluminum film may be stacked and then selectively etched, so that the light-transmitting conductive film 7017 and the cathode 7013 may be formed. In that case, etching can be performed with the use of the same mask, which is preferable.

The periphery of the cathode 7013 is covered with a partition wall 7019. The partition wall 7019 is formed using an organic resin film of polyimide, acrylic, polyamide, epoxy, or the like, an inorganic insulating film, or organic polysiloxane. It is particularly preferable that the partition wall 7019 be formed using a photosensitive resin material to have an opening over the cathode 7013 so that a sidewall of the opening is formed as an inclined surface with continuous curvature. In the case where a photosensitive resin material is used as the partition wall 7019, a step of forming a resist mask can be omitted.

The EL layer 7014 formed over the cathode 7013 and the partition wall 7019 may be formed as either a single layer or a plurality of layers stacked. When the EL layer 7014 is formed as a plurality of layers, the EL layer 7014 may be formed by stacking an electron-injection layer, an electron-transport layer, a light-emitting layer, a hole-transport layer, and a hole-injection layer in this order over the cathode 7013. Not all of these layers need to be provided.

The stacking order is not limited to the above; a hole-injection layer, a hole-transport layer, a light-emitting layer, an electron-transport layer, and an electron-injection layer may be stacked in this order over the cathode 7013. However, considering power consumption, it is preferable that an electron-injection layer, an electron-transport layer, a light-emitting layer, a hole-transport layer, and a hole-injection layer be stacked in this order over the cathode 7013 because of lower power consumption.

As the anode 7015 formed over the EL layer 7014, various materials can be used; it is preferable to use a material having a high work function, such as ZrN, Ti, W, Ni, Pt, Cr, or a light-transmitting conductive material of ITO, IZO, or ZnO. Further, a shielding film 7016, for example, a metal which shields light, a metal which reflects light, or the like is provided over the anode 7015. In this embodiment, an ITO film is used as the anode 7015, and a Ti film is used as the shielding film 7016.

The light-emitting element 7012 corresponds to a region where the light-emitting layer 7014 is sandwiched between the cathode 7013 and the anode 7015. In the case of the element structure illustrated in FIG. 3A, light emitted from the light-emitting element 7012 is ejected from the cathode 7013 side as indicated by an arrow.

In the example shown in FIG. 3A, a light-transmitting conductive film is used as a gate electrode layer, and light emitted from the light-emitting element 7012 passes through a color filter layer 7033 and a gate and source electrode layers of the thin film transistor 7011 to be ejected. A light-transmitting conductive film is used as the gate and source electrode layers of the thin film transistor 7011, so that the aperture ratio can be improved.

The color filter layer 7033 is formed by a droplet discharge method such as an inkjet method, a printing method, an etching method using a photolithography technique, or the like.

The color filter layer 7033 is covered with an overcoat layer 7034, and also covered with a protective insulating layer 7035. The overcoat layer 7034 with a thin thickness is shown in FIG. 3A; however, the overcoat layer 7034 has a function to planarize roughness due to the color filter layer 7033.

A contact hole which is formed in the protective insulating layer 7035 and an insulating layer 7032 and which reaches the connection electrode layer 7030 is provided so as to overlap the partition wall 7019. In the example shown in FIG. 3A, the connection electrode layer 7030 is formed using a metal conductive film, and therefore, by employing the layout in which the contact hole which reaches the connection electrode layer 7030, the partition wall 7019, and the connection electrode layer 7030 overlap each other, the aperture ratio can be improved.

Next, a light-emitting element having a dual emission structure will be described with reference to FIG. 3B.

In FIG. 3B, a cathode 7023 of a light-emitting element 7022 is formed over a light-transmitting conductive film 7027 that is electrically connected to the driving TFT 7021 through a connection electrode layer 7040, and an EL layer 7024 and an anode 7025 are stacked in this order over the cathode 7023. The connection electrode layer 7040 is electrically connected to a drain electrode layer of the driving TFT 7021 through a contact hole formed in an oxide insulating layer 7041.

As the light-transmitting conductive film 7027, a light-transmitting conductive film such as a film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added can be used.

The cathode 7023 can be formed using a variety of materials; it is preferable to use a material having a low work function, such as an alkali metal such as Li or Cs, an alkaline-earth metal such as Mg, Ca, or Sr, an alloy containing any of these (Mg:Ag, Al:Li, or the like), or a rare-earth metal such as Yb or Er. In this embodiment, the thickness of the cathode 7023 is a thickness that can transmit light (preferably, about 5 nm to 30 nm). For example, a 20-nm-thick aluminum film is used as the cathode 7023.

Note that the light-transmitting conductive film and the aluminum film may be stacked and then selectively etched, so that the light-transmitting conductive film 7027 and the cathode 7023 may be formed. In that case, etching can be performed with the use of the same mask, which is preferable.

The periphery of the cathode 7023 is covered with a partition wall 7029. The partition wall 7029 is formed using an organic resin film of polyimide, acrylic, polyamide, epoxy, or the like, an inorganic insulating film, or organic polysiloxane. It is particularly preferable that the partition wall 7029 be formed using a photosensitive resin material to have an opening over the cathode 7023 so that a sidewall of the opening is formed as an inclined surface with continuous curvature. In the case where a photosensitive resin material is used as the partition wall 7029, a step of forming a resist mask can be omitted.

The EL layer 7024 formed over the cathode 7023 and the partition wall 7029 may be formed as either a single layer or a plurality of layers stacked. When the EL layer 7024 is formed as a plurality of layers, the EL layer 7024 may be formed by stacking an electron-injection layer, an electron-transport layer, a light-emitting layer, a hole-transport layer, and a hole-injection layer in this order over the cathode 7023. Not all of these layers need to be provided.

The stacking order is not limited to the above; a hole-injection layer, a hole-transport layer, a light-emitting layer, an electron-transport layer, and an electron-injection layer may be stacked in this order over the cathode 7023. However, considering power consumption, it is preferable that an electron-injection layer, an electron-transport layer, a light-emitting layer, a hole-transport layer, and a hole-injection layer be stacked in this order over the cathode 7023 because of lower power consumption.

As the anode 7025 formed over the EL layer 7024, various materials can be used; it is preferable to use a material having a high work function, such as a light-transmitting conductive material of ITO, IZO, or ZnO. In this embodiment, an ITO film including silicon oxide is used as the anode 7025.

The light-emitting element 7022 corresponds to a region where the light-emitting layer 7024 is sandwiched between the cathode 7023 and the anode 7025. In the case of the element structure illustrated in FIG. 3B, light emitted from the light-emitting element 7022 is ejected from both the anode 7025 side and the cathode 7023 side as indicated by arrows.

In the example shown in FIG. 3B, the light-transmitting conductive film is used as a gate electrode layer, and light emitted from the light-emitting element 7022 to the cathode 7023 side passes through a color filter layer 7043 and a gate and source electrode layers of the thin film transistor 7021 to be ejected. A light-transmitting conductive film is used as the gate electrode layer and the source electrode layer of the thin film transistor 7021, the aperture ratio on the anode 7025 side can be approximately the same as the aperture ratio on the cathode 7023 side.

The color filter layer 7043 is formed by a droplet discharge method such as an inkjet method, a printing method, an etching method using a photolithography technique, or the like.

The color filter layer 7043 is covered with an overcoat layer 7044, and also covered with a protective insulating layer 7045.

A contact hole which is formed in a protective insulating layer 7045 and an insulating layer 7042 and which reaches the connection electrode layer 7040 is provided so as to overlap the partition wall 7029. In the example shown in FIG. 3B, the connection electrode layer 7040 is formed using a metal conductive film, and therefore, by employing the layout in which the contact hole which reaches the connection electrode layer 7040, the partition wall 7029, and the connection electrode layer 7040 overlap each other, the aperture ratio on the anode 7025 side can be approximately the same as the aperture ratio on the cathode 7023 side.

Note that in the case where the light-emitting element having a dual emission structure is used and full color display is performed on both display surfaces, light from the anode 7025 side does not pass through the color filter layer 7043; therefore, a sealing substrate provided with another color filter layer is preferably provided on the anode 7025.

Next, a light-emitting element having a top emission structure will be described with reference to FIG. 3C.

FIG. 3C is a cross-sectional view of a pixel in the case where the driving TFT 7001 is an n-channel TFT and light is emitted from a light-emitting element 7002 to an anode 7005 side. In FIG. 3C, a cathode 7003 of the light-emitting element 7002 is formed to be electrically connected to the driving TFT 7001 through a connection electrode layer 7050, and an EL layer 7004 and the anode 7005 are stacked in this order over a cathode 7003.

The cathode 7003 can be formed using a variety of materials; it is preferable to use a material having a low work function, such as an alkali metal such as Li or Cs, an alkaline-earth metal such as Mg, Ca, or Sr, an alloy containing any of these (Mg:Ag, Al:Li, or the like), or a rare-earth metal such as Yb or Er.

The periphery of the cathode 7003 is covered with a partition wall 7009. The partition wall 7009 is formed using an organic resin film of polyimide, acrylic, polyamide, epoxy, or the like, an inorganic insulating film, or organic polysiloxane. It is particularly preferable that the partition wall 7009 be formed using a photosensitive resin material to have an opening over the cathode 7003 so that a sidewall of the opening is formed as an inclined surface with continuous curvature. In the case where a photosensitive resin material is used as the partition wall 7009, a step of forming a resist mask can be omitted.

The EL layer 7004 formed over the cathode 7003 and the partition wall 7009 may be formed as either a single layer or a plurality of layers stacked. When the EL layer 7004 is formed as a plurality of layers, the EL layer 7004 may be formed by stacking an electron-injection layer, an electron-transport layer, a light-emitting layer, a hole-transport layer, and a hole-injection layer in this order over the cathode 7003. Not all of these layers need to be provided.

The stacking order is not limited to the above; a hole-injection layer, a hole-transport layer, a light-emitting layer, an electron-transport layer, and an electron-injection layer may be stacked in this order over the cathode 7003. In the case of that stacking order, the cathode 7003 functions as an anode.

In FIG. 3C, a hole-injection layer, a hole-transport layer, a light-emitting layer, an electron-transport layer, and an electron-injection layer are stacked in this order over a stacked film in which a Ti film, an aluminum film, and a Ti film are stacked in this order, and thereover, a stacked layer of a Mg:Ag alloy thin film and ITO is formed.

However, considering power consumption, it is that an electron-injection layer, an electron-transport layer, a light-emitting layer, a hole-transport layer, and a hole-injection layer are preferably stacked in this order over the cathode 7003 because of lower power consumption.

The anode 7005 is formed using a light-transmitting conductive material; for example, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

The light-emitting element 7002 corresponds to a region where the light-emitting layer 7004 is sandwiched between the cathode 7003 and the anode 7005. In the case of the element structure illustrated in FIG. 3C, light emitted from the light-emitting element 7002 is ejected from the anode 7005 side as indicated by an arrow.

In FIG. 3C, the example in which the thin film transistor 460 is used as the TFT 7001 is illustrated; however, there is no particular limitation, and a thin film transistor 450 can be used. When the thin film transistor 450 is used as the TFT 7001, the cathode 7003 and the drain electrode layer thereof are electrically connected to each other so as to be in contact with each other.

In FIG. 3C, the drain electrode layer of the TFT 7001 is electrically connected to the cathode 7003 with a connection electrode layer 7050 and an oxide insulating layer 7051 interposed therebetween, and is electrically connected to the cathode 7003 with a protective insulating layer 7052 and an insulating layer 7055 interposed therebetween. A planarizing insulating layer 7053 is formed using a resin material such as polyimide, acrylic, benzocyclobutene, polyamide, or epoxy. In addition to such resin materials, it is also possible to use a low-dielectric constant material (low-k material), a siloxane-based resin, phosphosilicate glass (PSG), borophosphosilicate glass (BPSG), or the like. Note that the planarizing insulating layer 7053 may be formed by stacking a plurality of insulating films formed of these materials. There is no particular limitation on the method for forming the planarizing insulating layer 7053, and the planarizing insulating layer 7053 can be formed, depending on the material, by a method such as a sputtering method, an SOG method, spin coating, dip coating, spray coating, or a droplet discharge method (such as an inkjet method, screen printing, offset printing, or the like), or a tool (equipment) such as a doctor knife, a roll coater, a curtain coater, or a knife coater.

The partition wall 7009 is provided so as to insulate the cathode 7003 and a cathode 7008 of an adjacent pixel. The partition wall 7009 is formed using an organic resin film such as polyimide, acrylic, polyamide, or epoxy; an inorganic insulating film; or organic polysiloxane. It is particularly preferable that the partition wall 7009 be formed using a photosensitive resin material to have an opening over the cathode 7003 so that a sidewall of the opening is formed as an inclined surface with continuous curvature. In the case where a photosensitive resin material is used for the partition wall 7009, a step of forming a resist mask can be omitted.

In the structure of FIG. 3C, in the case where full color display is performed, for example, the light-emitting element 7001 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements which include a white light-emitting element in addition to three kinds of light-emitting elements.

Further alternatively, in the structure of FIG. 3C, all of a plurality of light-emitting elements which is arranged may be white light-emitting elements and a sealing substrate having a color filter or the like may be arranged on the light-emitting element 7002, so that a light-emitting display device capable of full color display may be manufactured. A material which exhibits a single color such as white is formed and combined with a color filter or a color conversion layer, whereby full color display can be performed.

Needless to say, display of monochromatic light can be performed. For example, a lighting system may be formed with the use of white light emission, or an area-color light-emitting device may be formed with the use of a single color light emission.

If necessary, an optical film such as a polarizing film including a circularly polarizing plate may be provided.

Although organic EL elements are described as the light-emitting elements in this embodiment, an inorganic EL element can be provided as a light-emitting element as well.

Although the example is described in which a thin film transistor (a driving TFT) which controls the driving of a light-emitting element is electrically connected to a light-emitting element, a TFT for current control may be connected between the driving TFT and the light-emitting element.

Embodiment 3

In Embodiment 3, an example in which a pixel portion and a driver circuit are formed over one substrate by using the plurality of thin film transistors described in Embodiment 1 to manufacture an active matrix light-emitting display device will be described.

In Embodiment 3, not only a cross section of two thin film transistors and a connection portion which is illustrated in Embodiment 1 but also a wiring intersection portion and a capacitor are illustrated for description.

Figure 4:
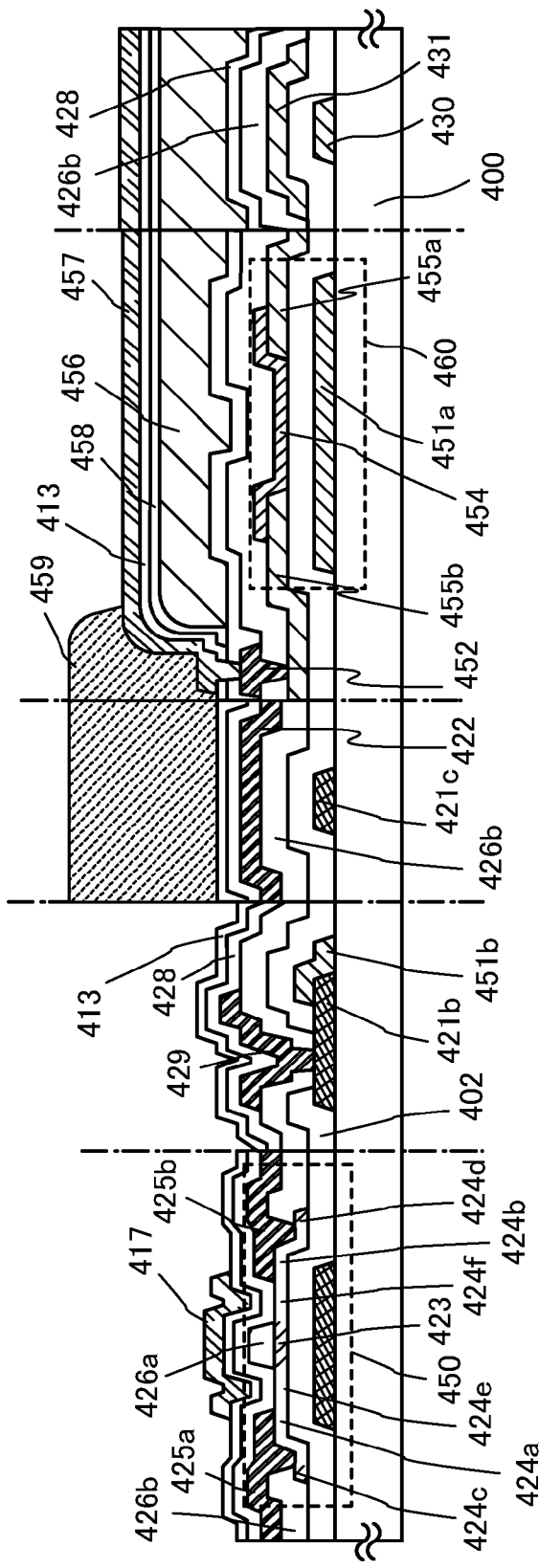
FIG. 4 is a cross-sectional view illustrating one embodiment of the present invention.

FIG. 4 is a cross-sectional view of a state of a substrate before an EL layer is formed over electrode (a pixel electrode). In FIG. 4, portions common to FIG. 1E are denoted by the same reference numerals.

In FIG. 4, a driving TFT which is electrically connected to a first electrode 457 is a bottom-contact type thin film transistor 460, which can be manufactured in accordance with Embodiment 1 in this embodiment.

After an insulating layer 428 is formed in accordance with Embodiment 1, a green color filter layer 456, a blue color filter layer, and a red color filter layer are formed. Each color filter layer is formed by a printing method, an inkjet method, an etching method using a photolithography technique, or the like. By providing the color filter layer, alignment of the color filter layer and a light-emitting region of a light-emitting element can be performed without depending on the alignment accuracy of the sealing substrate.

Next, an overcoat layer 458 which covers the green color filter layer 456, the blue color filter layer, and the red color filter layer is formed. The overcoat layer 458 is formed using a light-transmitting resin.

An example in which full color display is performed using three colors of RGB is described in this embodiment; however, the present invention is not particularly limited thereto, and full color display device may be performed using four colors of RGBW.

Next, a protective insulating layer 413 covering the overcoat layer 458 and the insulating layer 428 is formed. The protective insulating layer 413 is formed using an inorganic insulating film such as a silicon nitride film, an aluminum nitride film, a silicon nitride oxide film, or an aluminum oxynitride film. It is preferable that the protective insulating layer 413 be an insulating film having the same component as that of the insulating film 428 because they can be etched by one step when a contact hole is formed.

Next, the protective insulating layer 413 and the insulating film 428 are selectively etched by a photolithography step, so that a contact hole reaching the connection electrode layer 452 is formed. In addition, by this photolithography step, the protective insulating layer 413 and the insulating film 428 in a terminal portion are selectively etched to expose part of a terminal electrode. Further, in order to connect a second electrode of a light-emitting element formed later to a common potential line, a contact hole reaching the common potential line is also formed.

Next, a transparent conductive film is formed, and a photolithography step is performed thereon, so that a first electrode 457 which is electrically connected to the connection electrode layer 452 is formed.

Next, a partition wall 459 is formed to cover the periphery of the first electrode 457. The partition wall 459 is formed using an organic resin film of polyimide, acrylic, polyamide, epoxy, or the like, an inorganic insulating film, or organic polysiloxane. It is particularly preferable that the partition wall 459 be formed using a photosensitive resin material to have an opening over the first electrode 457 so that a sidewall of the opening is formed as an inclined surface with continuous curvature. In the case where a photosensitive resin material is used as the partition wall 459, a step of forming a resist mask can be omitted.

Through the above process, the state of the substrate show in FIG. 4 can be obtained. After the above process, as described in Embodiment 2 as an example, an EL layer is formed over the first electrode 457, and a second electrode is formed over the EL layer, thereby forming a light-emitting element. The second electrode is electrically connected to the common potential line.

In the pixel portion, a capacitor is formed as shown in FIG. 4. The capacitor shown in FIG. 4 is formed using a gate insulating layer 402 as a dielectric, a capacitor wiring layer 430, and a capacitor electrode layer 431. In a light-emitting device, capacitor wiring layer 430 is a part of a power supply line, and the capacitor electrode layer 431 is a part of a gate electrode layer of a driving TFT.

Further, in the wiring intersection portion, in order to reduce the parasitic capacitance as shown in FIG. 4, the gate insulating layer 402 and an oxide insulating layer 426b are sacked between a gate wiring layer 421c and a source wiring layer 422. Although the example in which the gate wiring layer 421c is a metal conductive film is described in FIG. 4, a light-transmitting conductive film which is the same as a gate electrode layer 451a of the thin film transistor 460 may be used as well.

In FIG. 4, a TFT provided in the driver circuit is a channel protective thin film transistor 450, which can be manufactured in accordance with Embodiment 1 in this embodiment.

In FIG. 4, at least one TFT provided in the driver circuit is the thin film transistor 450, which can be manufactured in accordance with Embodiment 1 in this embodiment.

A conductive layer 417 may be provided over an oxide semiconductor layer of the thin film transistor 450 of the driver circuit. The conductive layer 417 can be formed using the same material by the same step as the first electrode 457.

In addition, by providing the conductive layer 417 so as to overlap a channel formation region 423 of the oxide semiconductor layer, in a bias-temperature stress test (hereinafter, referred to as a BT test) for examining reliability of a thin film transistor, the amount of change in the threshold voltage of the thin film transistor 450 between before and after the BT test can be reduced. The conductive layer 417 has a potential which is the same as or different from that of the gate electrode layer 421a, and can function as a second gate electrode layer. Alternatively, the potential of the conductive layer 417 may be GND or 0 V, or the conductive layer 417 may be in a floating state.

Since a thin film transistor is easily broken due to static electricity or the like, it is preferable to provide a protective circuit over the same substrate as the pixel portion or the driver circuit. The protective circuit is preferably formed using a non-linear element including an oxide semiconductor layer. For example, protective circuits are provided between the pixel portion and a scan line input terminal and between the pixel portion and a signal line input terminal. In this embodiment, a plurality of protective circuits are provided so as to prevent breakage of the a pixel transistor and the like which can be caused when surge voltage due to static electricity or the like is applied to a scan line, a signal line, or a capacitor bus line. Therefore, the protective circuit is formed so as to release charge to a common wiring when surge voltage is applied to the protective circuit. Further, the protective circuit includes a non-linear element arranged in parallel to the scan line. The non-linear element includes a two-terminal element such as a diode or a three-terminal element such as a transistor. For example, the non-linear element can be formed through the same process as the thin film transistor 460 in the pixel portion, and can be made to have the same properties as a diode by connecting a gate terminal to a drain terminal of the non-linear element.

This embodiment can be combined with Embodiment 1 or Embodiment 2.

Embodiment 4

In Embodiment 4, an example of the structure of a terminal portion provided over the same substrate as a thin film transistor will be shown in FIGS. 5A1 and 5A2 and 5B1 and 5B2. Note that in FIGS. 5A1 to 5B2, portions common to FIG. 4 are denoted by the same reference numerals as FIG. 4.

FIGS. 5A1 and 5A2 are a cross-sectional view of a gate wiring terminal portion and a top view thereof. FIG. 5A1 is a cross-sectional view taken along line C1-C2 in FIG. 5A2. In FIG. 5A1, a conductive layer 415 formed over a stacked layer of an insulating layer 428 and a protective insulating layer 413 is a connection terminal electrode which functions as an input terminal. In the terminal portion in FIG. 5A1, a first terminal 411 formed using the same material as a gate wiring layer 421c and a connection electrode layer 412 formed using the same material as a source wiring layer 422 overlap each other with a gate insulating layer 402 interposed therebetween, and are electrically connected to each other through the conductive layer 415. Further, the conductive layer 415 can be formed using the same material having a light-transmitting property in the same step as a first electrode 457.

FIGS. 5B1 and 5B2 are a cross-sectional view and a top view of a source wiring terminal portion. FIG. 5B1 is a cross-sectional view taken along line C3-C4 in FIG. 5B2. In FIG. 5B1, a conductive layer 418 formed over the insulating layer 428 and the protective insulating layer 413 is a connection terminal electrode which functions as an input terminal. Further, in the terminal portion in FIG. 5B1, an electrode layer 416 formed using the same material as the gate wiring layer 421c is located below and overlaps a second terminal 414 which is electrically connected to a source wiring, with the gate insulating layer 402 interposed therebetween. The electrode layer 416 is not electrically connected to the second terminal 414, and a capacitance as a countermeasure against noise or static electricity can be formed by setting the potential of the electrode layer 416 so as to be different from that of the second terminal 414, for example, floating, GND, 0 V, or the like. Further, the second terminal 414 is electrically connected to the conductive layer 418 and the insulating layer 428 and the protective insulating layer 413 are provided therebetween. The conductive layer 418 can be formed using the same material having a light-transmitting property in the same step as the first electrode 457.

A plurality of gate wirings, source wirings, common potential lines, and power supply lines are provided depending on the pixel density. In the terminal portion, the first terminal at the same potential as the gate wiring, the second terminal at the same potential as the source wiring, a third terminal at the same potential as the power supply line, and a fourth terminal at the same potential as the common potential line, and the like are arranged. The number of each of the terminals may be any number, and can be determined as appropriate.

This embodiment can be combined with Embodiment 1, Embodiment 2, or Embodiment 3.

Embodiment 5

In Embodiment 5, examples of an element structure any of the light-emitting elements used for FIGS. 3A and 3C illustrated in Embodiment 2 will be described.

Figure 6A:
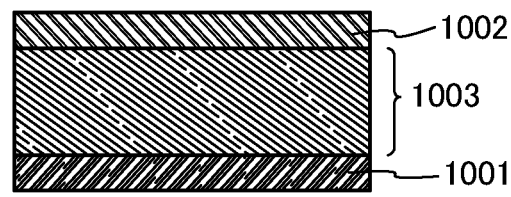
FIGS. 6A and 6B are cross-sectional views each illustrating one embodiment of the present invention.

In an element structure illustrated in FIG. 6A, an EL layer 1003 including a light-emitting region is sandwiched between a pair of electrodes (a first electrode 1001 and a second electrode 1002). Note that the first electrode 1001 is used as an anode and the second electrode 1002 is used as a cathode as an example in the following description of Embodiment 5.

The EL layer 1003 includes at least a light-emitting layer, and may also have a stacked-layer structure including a functional layer other than the light-emitting layer. Examples of the functional layer other than the light-emitting layer include a layer containing a substance having a high hole-injection property, a substance having a high hole-transport property, a substance having a high electron-transport property, a substance having a high electron-injection property, a bipolar substance (a substance having high electron and hole transport properties), or the like. Specifically, functional layers such as a hole-injection layer, a hole-transport layer, an electron-transport layer, and an electron-injection layer can be used in combination as appropriate.

A light-emitting element illustrated in FIG. 6A emits light when current flows by the potential difference generated between the first electrode 1001 and the second electrode 1002, and holes and electrons are recombined in the EL layer 1003. That is, the light-emitting region is formed in the EL layer 1003.

Light emission is extracted outside through one of or both the first electrode 1001 and the second electrode 1002. Accordingly, one of or both the first electrode 1001 and the second electrode 1002 are formed of a light-transmitting substance.

Figure 6B:
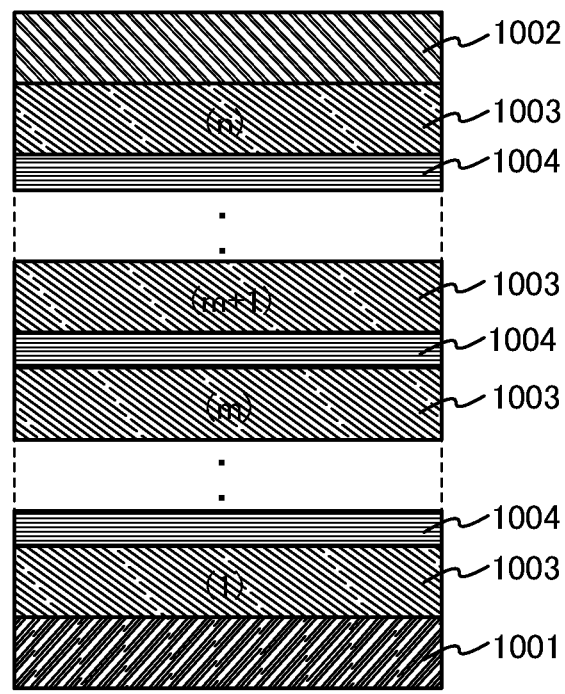

Note that a plurality of EL layers may be formed between the first electrode 1001 and the second electrode 1002 as illustrated in FIG. 6B. In the case where n (n is a natural number of 2 or more) layers are stacked, a charge generation layer 1004 is preferably provided between an m-th EL layer and an (m+1)-th EL layer. Note that m is a natural number, and equal to or greater than 1 and less than or equal to (n−1).

The charge generation layer 1004 may be formed of a composite material of an organic compound and a metal oxide, a metal oxide, or a composite material of an organic compound and an alkali metal, an alkaline earth metal, or a compound thereof; alternatively, these materials may be combined as appropriate. The composite material of an organic compound and a metal oxide includes, for example, an organic compound and a metal oxide such as $V_2O_5$, $MoO_3$, or $WO_3$. As the organic compound, various compounds such as an aromatic amine compound, a carbazole derivative, aromatic hydrocarbon, and a high molecular compound (oligomer, dendrimer, polymer, or the like) can be used. As the organic compound, it is preferable to use the organic compound which has a hole-transport property and has a hole mobility of $10^{-6}$ cm$^2$/Vs or higher. However, other substances than the above described materials may also be used as long as the substances have higher hole-transport property than electron-transport property. These materials used for the charge generation layer 1004 are excellent in carrier-injection property and carrier-transport property, by which a light-emitting element which can be driven with low current and low voltage can be obtained.

Note that the charge generating layer 1004 may be formed using a combination of a composite material of an organic compound and a metal oxide with another material. For example, a layer containing a composite material of an organic compound and a metal oxide may be combined with a layer containing a compound selected from substances with an electron-donation property and a compound with a high electron-transport property. A layer containing a composite material of an organic compound and a metal oxide may be combined with a transparent conductive film.

As for a light-emitting element having such a structure, problems such as energy transfer and quenching are unlikely to occur, and a light-emitting element which has both high light emission efficiency and long lifetime can be easily obtained due to expansion in the choice of materials. Moreover, a light-emitting element which provides phosphorescence from one of the EL layers and fluorescence from the other of the EL layers can be easily obtained.

Note that the charge generation layer 1004 has a function of injecting holes to one EL layer 1003 which is formed in contact with the charge generation layer 1004 and a function of injecting electrons to the other EL layer 1003 which is formed in contact with the charge generation layer 1004, when voltage is applied to the first electrode 1001 and the second electrode 1002.

A light-emitting element shown in FIG. 6B can provide a variety of emission colors by changing the type of the light-emitting substance that is used for the light-emitting layer. In addition, a plurality of light-emitting substances of different emission colors are used as the light-emitting substance, whereby light emission having a broad spectrum or white light emission can also be obtained.

In the case of obtaining white color light using the light-emitting element shown in FIG. 6B, as for the combination of a plurality of light-emitting layers, a structure for emitting white light including red light, green light, and blue light may be used. For example, the structure may include a first EL layer containing a blue fluorescent substance as a light-emitting substance and a second EL layer containing red and green phosphorescent substances as light-emitting substances. Alternatively, the structure may include a first EL layer exhibiting red light emission, a second EL layer exhibiting green light emission, and a third EL layer exhibiting blue light emission. Also with a structure including light-emitting layers emitting light of complementary colors, white light emission can be obtained. When light emission from the first EL layer and light emission from the second EL layer have complementary colors to each other in an element including two EL layers stacked, the combination of colors are as follows: blue and yellow, blue-green and red, and the like.

Note that in the structure of the above-mentioned stacked-layer element, by providing the charge generation layer between the stacked EL layers, the element can have long lifetime in a high-luminance region while keeping the current density low. In addition, a voltage drop due to resistance of the electrode material can be reduced, whereby uniform light emission in a large area is possible.

This embodiment can be combined with any one of Embodiments 1 to 4.

Embodiment 6

Figure 7A:
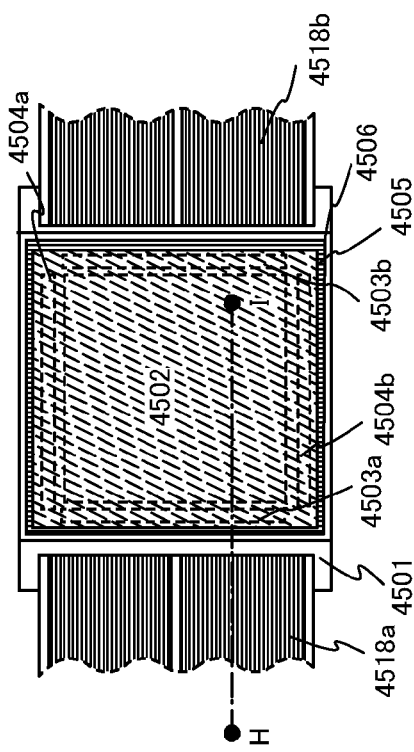
FIGS. 7A and 7B are a cross-sectional view and a plane view illustrating one embodiment of the present invention.
Figure 7B:
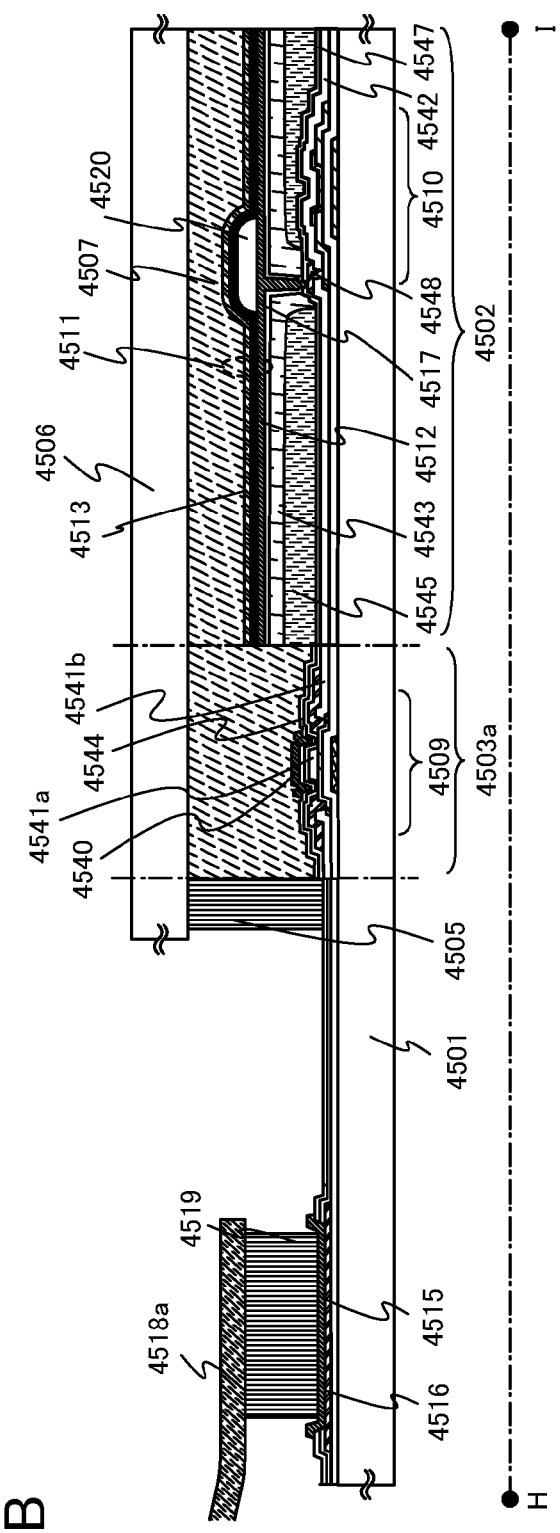

In Embodiment 6, the appearance and a cross section of a light-emitting display panel (also referred to as a light-emitting panel) are described with reference to FIGS. 7A and 7B. FIG. 7A is a plan view of a panel in which a thin film transistor and a light-emitting element formed over a first substrate are sealed between the first substrate and a second substrate with a sealant. FIG. 7B is a cross-sectional view along line H-I of FIG. 7A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

Further, the pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 7B.

For the thin film transistors 4509 and 4510, the highly reliable thin film transistor including an oxide semiconductor layer described in Embodiment 1 can be employed. The thin film transistor 450 described in Embodiment 1 and the thin film transistor 460 can be used as the thin film transistors for a driver circuit 4509 and the thin film transistor 4510 for a pixel, respectively. In Embodiment 6, the thin film transistors 4509 and 4510 are n-channel thin film transistors.

Over an insulating layer 4544, a conductive layer 4540 is formed so as to overlap a channel formation region of an oxide semiconductor layer of the thin film transistors for a driver circuit 4509. By providing the conductive layer 4540 so as to overlap the channel formation region of the oxide semiconductor layer, the amount of change in the threshold voltage of the thin film transistor 4509 between before and after the BT test can be reduced. In addition, the conductive layer 4540 may have the same potential as the gate electrode layer of the thin film transistor 4509 or have potential different from that of the thin film transistor 4509 and can function as a second gate electrode layer. Further, the conductive layer 4540 may have a potential of GND, or 0 V, or be in a floating state.

An insulating layer 4541a functioning as a channel protective layer and an insulating layer 4541b covering the outer edge of the stacked layer of the oxide semiconductor layers are formed in the thin film transistor 4509.

Further, the thin film transistor 4510 is electrically connected to a first electrode 4517 through a connection electrode layer 4548. Further, an oxide insulating layer 4542 covering the oxide semiconductor layer of the thin film transistor 4510 is formed in the thin film transistor 4510.

The oxide insulating layers 4541a, 4541b and 4542 may be formed using a material and a method the same as or similar to those of the oxide insulating layers 426a and 426b described in Embodiment 1. In addition, the insulating layer 4544 covering the oxide insulating layers 4541a, 4541b and 4542 is formed. The insulating layer 4544 may be formed using a material and a method the same as or similar to those of the insulating layer 428 described in Embodiment 1.

An a color filter layer 4545 is formed over the thin film transistor 4510 so as to overlap a light emitting region of a light-emitting element 4511.

Further, in order to reduce the surface roughness of the color filter layer 4545, the color filter layer 4545 is covered with an overcoat layer 4543 functioning as a planarization insulating film.

Further, an insulating layer 4546 is formed over the overcoat layer 4543. The insulating layer 4546 may be formed using a material and a method the same as or similar to those of the protective insulating layer 413 described in Embodiment 1.

Reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the light-emitting element 4511 has a stacked-layer structure of the first electrode layer 4517, an electroluminescent layer 4512, and the second electrode layer 4513, and there is no particular limitation on the structure. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

A variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed using the same conductive film as the first electrode layer 4517 included in the light-emitting element 4511, and a terminal electrode 4516 is formed using the same conductive film as the source and drain electrode layers included in the thin film transistor 4509.

The connection terminal electrode 4515 is electrically connected to a terminal included in the FPC 4518a via an anisotropic conductive film 4519.

As the second substrate located in the direction in which light is extracted from the light-emitting element 4511 needs to have a light-transmitting property. In that case, a light-transmitting material such as a glass plate, a plastic plate, a polyester film, or an acrylic film is used for the second substrate 4506.

As the filler 4507, an ultraviolet curable resin or a thermosetting resin can be used, as well as an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by roughness on the surface so as to reduce the glare can be performed.

The signal line driver circuits 4503a and 4503b and the scanning line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 7A and 7B.

Through the above process, a highly reliable light-emitting display device (display panel) as a semiconductor device can be manufactured.

Embodiment 7

In Embodiment 7, an example will be described in which at least a part of a driver circuit and a thin film transistor disposed in a pixel portion are formed over one substrate.

The thin film transistor disposed in the pixel portion is formed in accordance with Embodiment 1. Further, the thin film transistor described in Embodiment 1 is an n-channel TFT, and thus part of a driver circuit that can include an n-channel TFT among driver circuits is formed over the same substrate as that of the thin film transistor in the pixel portion.

Figure 9A:
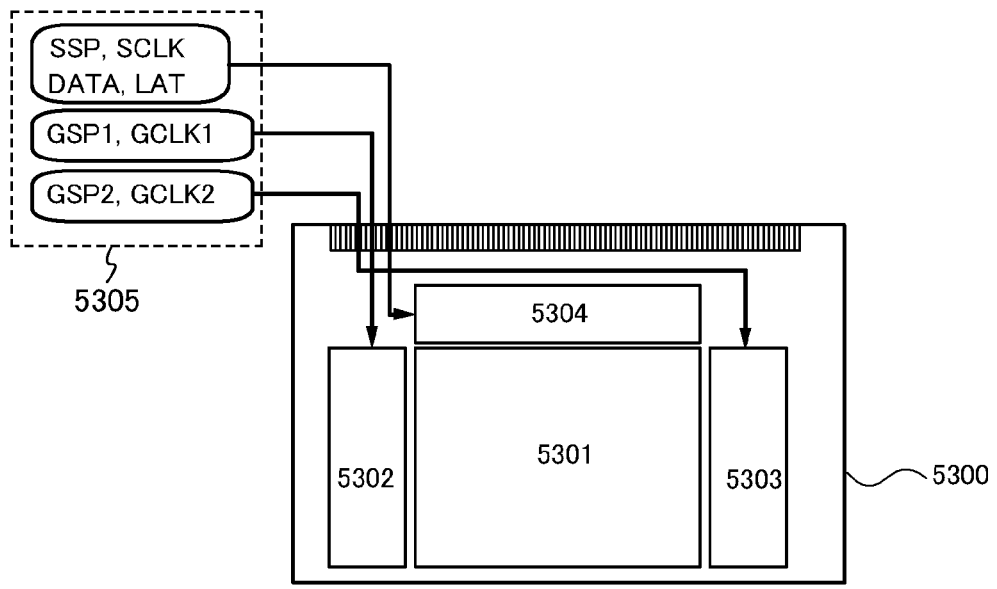
FIGS. 9A and 9B are block diagrams each of a semiconductor device.

FIG. 9A illustrates an example of a block diagram of an active matrix display device. Over a substrate 5300 of the display device, a pixel portion 5301, a first scan line driver circuit 5302, a second scan line driver circuit 5303, and a signal line driver circuit 5304 are provided. In the pixel portion 5301, a plurality of signal lines are provided by being extended from the signal line driver circuit 5304, and a plurality of scan lines are provided by being extended from the first scan line driver circuit 5302 and the second scan line driver circuit 5303. Pixels each including a display element are arranged in matrix at intersections of the scan lines and the signal lines. The substrate 5300 of the display device is connected to a timing control circuit 5305 (also called a controller or a control IC) with a connection portion such as a flexible printed circuit (FPC).

In FIG. 9A, the first scan line driver circuit 5302, the second scan line driver circuit 5303, and the signal line driver circuit 5304 are formed over the same substrate 5300 as the pixel portion 5301. Therefore, the number of components of a driver circuit and the like which are provided externally is decreased, which leads to cost reduction. Further, the number of wirings in the connection portion due to extension of wirings is decreased as compared to the case where a driver circuit is provided for the outside of the substrate 5300, which leads to improvement of the reliability or improvement of the yield.

As an example, the timing control circuit 5305 supplies a first scan line driver circuit start signal (GSP1) and a first scan line driver circuit clock signal (GCLK1) to the first scan line driver circuit 5302. Further, as an example, the timing control circuit 5305 supplies a second scan line driver circuit start signal (GSP2) (also called a start pulse) and a second scan line driver circuit clock signal (GCLK2) to the second scan line driver circuit 5303. Further, as an example, the timing control circuit 5305 supplies a signal line driver circuit start signal (SSP), a signal line driver circuit clock signal (SCLK), video signal data (DATA) (also simply called a video signal) and a latch signal (LAT) to the signal line driver circuit 5304. The clock signals may be a plurality of clock signals whose periods are deviated from each other or may be supplied together with an inverted clock signal (CKB). One of the first scan line driver circuit 5302 and the second scan driver circuit 5303 can be omitted.

Figure 9B:
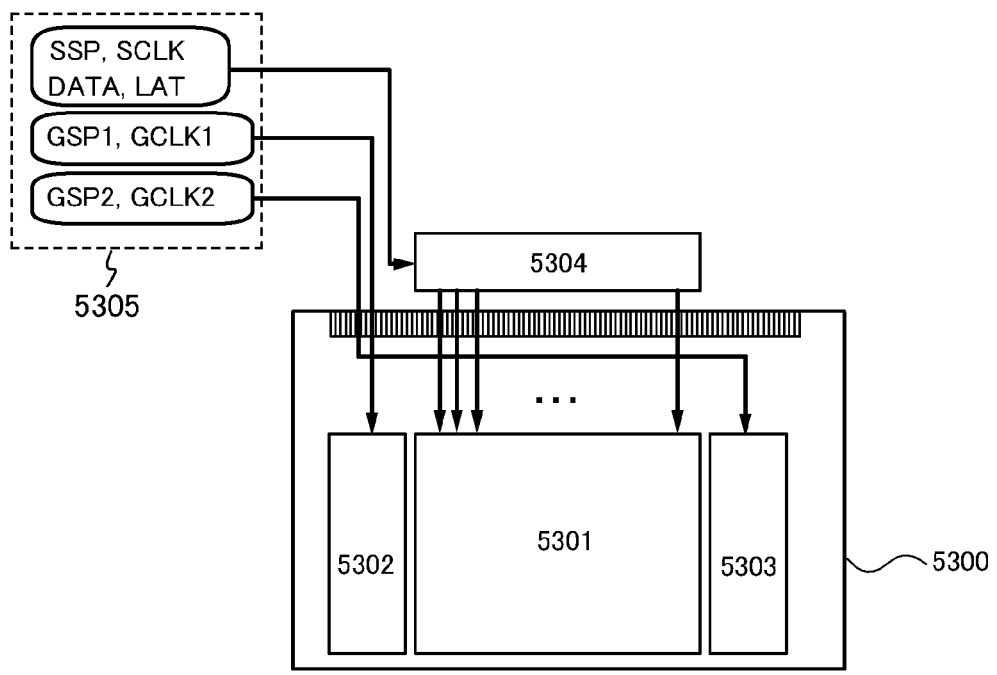

FIG. 9B shows a structure in which circuits with low driving frequency (e.g., the first scan line driver circuit 5302 and the second scan driver circuit 5303) are formed over the same substrate 5300 as the pixel portion 5301 and the signal line driver circuit 5304 is formed over a substrate which is different from that of the pixel portion 5301. With this structure, a driver circuit formed over the substrate 5300 can be formed using a thin film transistor with lower field-effect mobility as compared to that of a transistor formed using a single crystal semiconductor. Accordingly, increase in the size of the display device, reduction in the number of steps, reduction in cost, improvement in yield, or the like can be achieved.

Figure 10A:
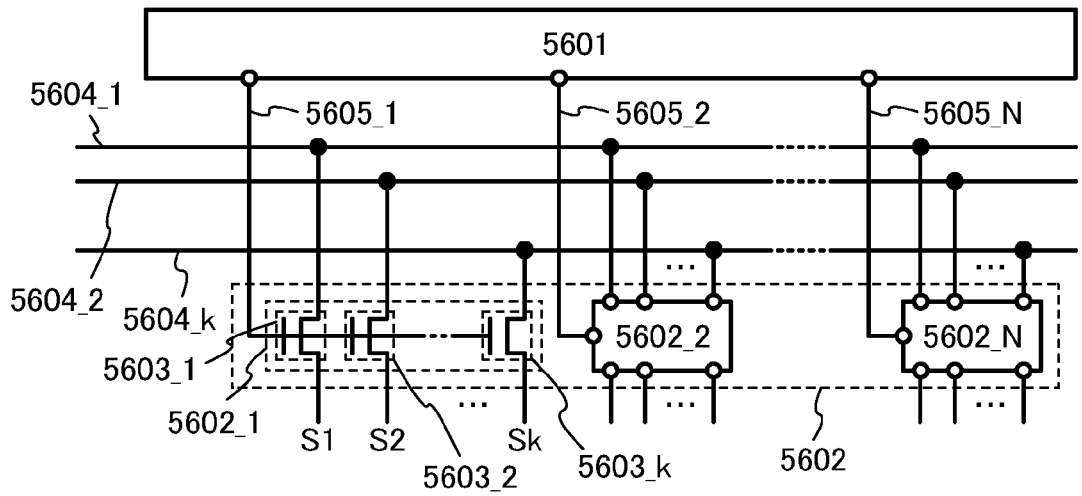
FIGS. 10A and 10B are views illustrating a structure of a signal line driver circuit and a timing chart thereof.
Figure 10B:
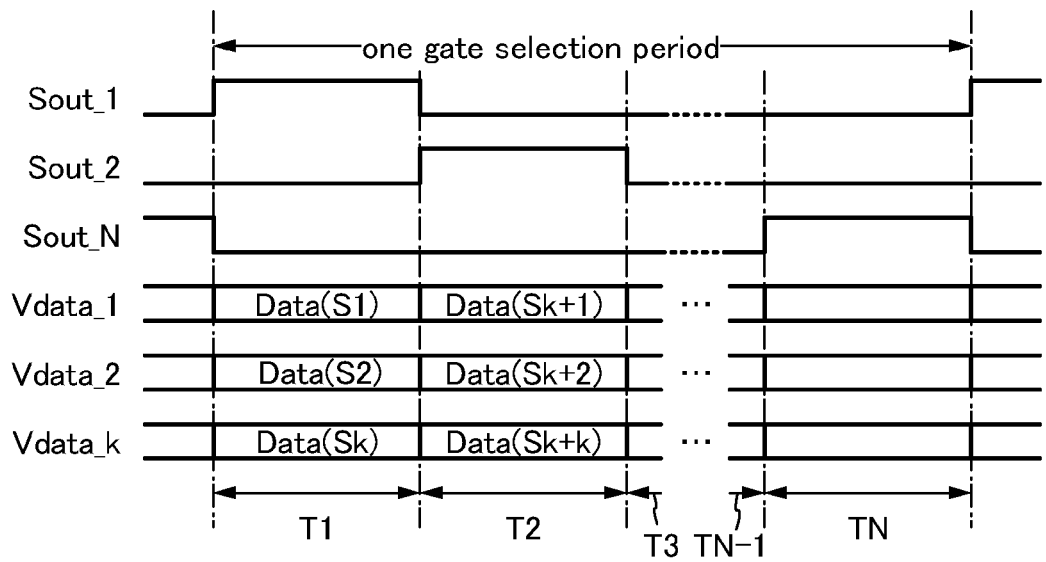

The thin film transistor described in Embodiment 1 is an n-channel TFT. In FIGS. 10A and 10B, an example of a structure and operation of a signal line driver circuit which is formed using an n-channel TFT is described.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_$k$ (k is a natural number). An example in which the thin film transistors 5603_1 to 5603_$k$ are n-channel TFTs will be described.

A connection relation of the signal line driver circuit will be described by using the switching circuit 5602_1 as an example. First terminals of the thin film transistors 5603_1 to 5603_$k$ are connected to respective wirings 5604_1 to 5604_$k$. Second terminals of the thin film transistors 5603_1 to 5603_$k$ are connected to respective signal lines S1 to S$k$. Gates of the thin film transistors 5603_1 to 5603_$k$ are connected to a wiring 5605_1.

The shift register 5601 has a function of outputting an H level signal (also called an H signal or a high power supply potential level) to the wirings 5605_1 to 5605_N in order so as to select the switching circuits 5602_1 to 5602_N in order.

The switching circuit 5602_1 has a function of controlling electrical continuity between the wirings 5604_1 to 5604_$k$ and the signal lines S1 to S$k$ (electrical continuity between the first terminal and the second terminal), namely a function of controlling whether or not to supply potentials of the wirings 5604_1 to 5604_$k$ to the signal lines S1 to S$k$. In this manner, the switching circuit 5602_1 functions as a selector. Further, the thin film transistors 5603_1 to 5603_$k$ each have a function of controlling electrical continuity between their respective wirings 5604_1 to 5604_k and their respective signal lines S1 to Sk, namely a function of controlling whether or not to supply their respective potentials of the wirings 5604_1 to 5604_k to their respective signal lines S1 to Sk. In this manner, each of the thin film transistors 5603_1 to 5603_k functions as a switch.

Note that video signal data (DATA) is input to each of the wirings 5604_1 to 5604_k. The video signal data (DATA) is an analog signal corresponding to image data or an image signal in many cases.

Next, operation of the signal line driver circuit in FIG. 10A will be described with reference to a timing chart in FIG. 10B. In FIG. 10B, an example of signals Sout_1 to Sout_N and signals Vdata_1 to Vdata_k is shown. The signals Sout_1 to Sout_N are examples of output signals of the shift register 5601 and the signals Vdata_1 to Vdata_k are examples of respective signals which are input to the wirings 5604_1 to 5604_k. One operation period of the signal line driver circuit corresponds to one gate selection period in a display device. For example, one gate selection period is divided into periods T1 to TN. The periods T1 to TN are periods for writing video signal data (DATA) to pixels in selected rows.

Note that as for the components shown in the drawings in Embodiment 7, distortion in a signal waveform and the like are exaggerated to be shown for clarity, in some cases. Therefore, there is no limitation on the scale of the components.

In the periods T1 to TN, the shift register 5601 sequentially outputs an H level signal to the wirings 5605_1 to 5605_N. For example, in the period T1, the shift register 5601 outputs an H level signal to the wiring 5605_1. Consequently, the thin film transistors 5603_1 to 5603_k are turned on, which brings electrical continuity between the wirings 5604_1 to 5604_k and the signal lines S1 to Sk. At that time, Data (S1) to Data (Sk) are input to the wirings 5604_1 to 5604_k, respectively. The Data (S1) to Data (Sk) are written into pixels in a selected row in the first to k-th columns through their respective thin film transistors 5603_1 to 5603_k. Thus, in the periods T1 to TN, video signal data (DATA) is written into the pixels in the selected row sequentially every k columns.

By writing video signal data (DATA) to pixels per a plurality of columns as described above, the number of video signal data (DATA) or the number of wirings can be reduced. Thus, the number of connections to an external circuit can be reduced. Further, by writing video signals to pixels per a plurality of columns, writing time of period can be extended and insufficiency of writing of video signals can be prevented.

Note that as the shift register 5601 and the switching circuit 5602, a circuit including the thin film transistor described in any of Embodiments 1, 2, 5 and 6 can be used. In that case, all the transistors included in the shift transistor 5601 can be n-channel transistors or all the transistors included in the shift transistor 5601 can be p-channel transistors.

An embodiment of a shift register which is used for part(s) of a scan line driver circuit and/or a signal line driver circuit will be described with reference to FIGS. 11A to 11D and FIGS. 12A and 12B.

A structure of the scan line driver circuit is described below. The scan line driver circuit includes a shift register. The scan line driver circuit may also include a level shifter, a buffer, or the like in some cases. In the scan line driver circuit, when the clock signal (CLK) and the start pulse signal (SP) are input to the shift register, a selection signal is generated. The generated selection signal is buffered and amplified by the buffer, and then supplied to a corresponding scan line. Gate electrodes of transistors in pixels of one line are connected to the scan line. In order to turn on the transistors in the pixels of one line all at once, a buffer which can supply a large current is used.

Figure 11A:
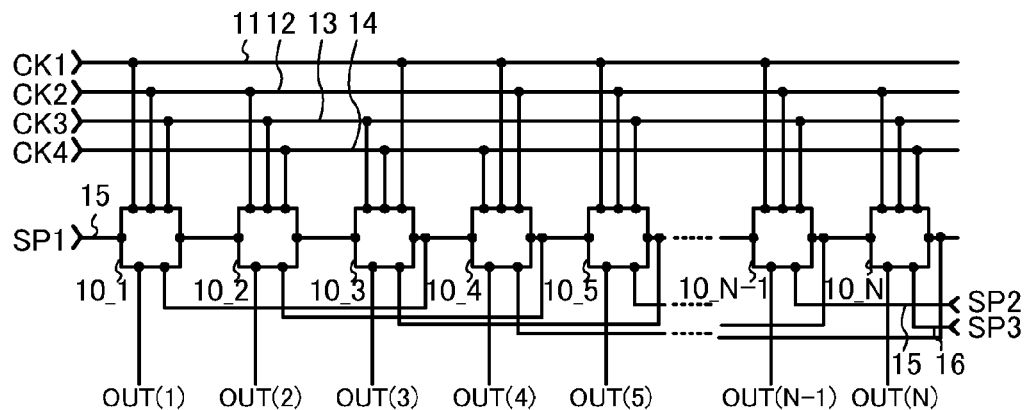
FIGS. 11A to 11D are views illustrating a structure of a shift register.

The shift register included in the scan line driver circuit and/or the signal line driver circuit is described below. The shift register includes first to N-th pulse output circuits 10_1 to 10_N (N is a natural number of 3 or more) (see FIG. 11A). A first clock signal CK1 from a first wiring 11, a second clock signal CK2 from a second wiring 12, a third clock signal CK3 from a third wiring 13, and a fourth clock signal CK4 from a fourth wiring 14 are supplied to the first to N-th pulse output circuits 10_1 to 10_N of the shift register shown in FIG. 11A. A start pulse SP1 (a first start pulse) from a fifth wiring 15 is input to the first pulse output circuit 10_1. A signal from the pulse output circuit in the previous stage (the signal called a previous stage signal OUT (n−1)) (n is a natural number of more than or equal to 2 and lower than or equal to N) is input to the n-th pulse output circuit in the second or later stage. A signal from the third pulse output circuit 10_3 in the stage two stages after the first pulse output circuit 10_1 is input to the first pulse output circuit 10_1; similarly, a signal from the (n+2)-th pulse output circuit 10_(n+2) in the stage two stages after the n-th pulse output circuit 10_n (the signal called a next stage signal OUT (n+2)) is input to the n-th pulse output circuit. In this manner, a first output signal (corresponding one of OUT (1) (SR) to OUT (N) (SR)) to be input to the pulse output circuit of the next stage and/or the two-stage-previous stage and a second output signal (corresponding one of OUT (1) to OUT (N)) which is electrically connected to another wiring or the like are output from each of the pulse output circuits. Note that as shown in FIG. 11A, the next stage signal OUT (n+2) is not input to the last two stages of the shift register; therefore, as an example, a second start pulse SP2 may be input to one of the last two stages of the shift register and a third start pulse SP3 may be input to the other of the same.

Note that a clock signal (CK) is a signal which oscillates between an H level and an L level (also called an L signal or a low power supply potential level) at a constant cycle. The first to the fourth clock signals (CK1) to (CK4) are delayed by ¼ period sequentially. In this embodiment, by using the first to fourth clock signals (CK1) to (CK4), control of driving of the pulse output circuit or the like is performed. Note that the clock signal is also called GCLK or SCLK depending on a driver circuit to which the clock signal is input; however, description is made in this embodiment by using CK as the clock signal.

Figure 11B:
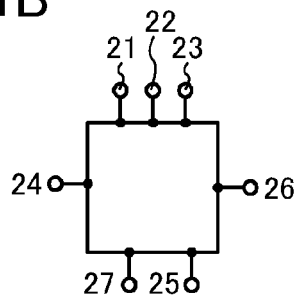

Each of the first to N-th pulse output circuits 10_1 to 10_N includes a first input terminal 21, a second input terminal 22, a third input terminal 23, a fourth input terminal 24, a fifth input terminal 25, a first output terminal 26, and a second output terminal 27 (see FIG. 11B). The first input terminal 21, the second input terminal 22, and the third input terminal 23 are electrically connected to any of the first to fourth wirings 11 to 14. For example, in FIG. 11A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 102 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

In the first pulse output circuit 10_1, the first clock signal CK1 is input to the first input terminal 21; the second clock signal CK2 is input to the second input terminal 22; the third clock signal CK3 is input to the third input terminal 23; the first start pulse SP1 is input to the fourth input terminal 24; the next stage signal OUT (3) is input to the fifth input terminal 25; the first output signal OUT (1) (SR) is output from the first output terminal 26; and the second output signal OUT (1) is output from the second output terminal 27.

Figure 11C:
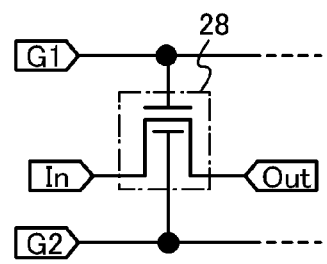

In each of the first to N-th pulse output circuits 10_1 to 10_N, as well as a thin film transistor (TFT) having three terminals, the thin film transistor having four terminals described in the above embodiment can be used. In FIG. 11C, a symbol of a thin film transistor having four terminals 28, which is the same as the TFT described in the above embodiment is illustrated. The symbol of the thin film transistor having four terminals 28 shown in FIG. 11C means the thin film transistor having four terminals described in one of the above embodiments, and is used in the drawings and the like hereinbelow. In this specification, in the case where two gate electrodes are provided with a semiconductor layer interposed therebetween in a thin film transistor, one gate electrode under the semiconductor layer can also be referred to as a lower gate electrode and the other gate electrode over the semiconductor layer can also be referred to as an upper gate electrode. The thin film transistor 28 is an element capable of electrical control between an IN terminal and an OUT terminal by a first control signal G1 input to the lower gate electrode and a second control signal G2 input to the upper gate electrode.

In the case where an oxide semiconductor is used for a semiconductor layer including a channel formation region of a thin film transistor, the threshold voltage may be shifted in a negative or positive direction depending on a manufacturing process thereof. Thus, it is preferable that the thin film transistor in which an oxide semiconductor is used for a semiconductor layer including a channel formation region have a structure where the threshold voltage can be controlled. The threshold voltage of the thin film transistor 28 shown in FIG. 11C can be controlled to be a predetermined value by controlling the potential(s) of the lower gate electrode and/or the upper gate electrode which are provided over and under a channel formation region of the thin film transistor 28 with a gate insulating layer interposed therebetween.

Next, an example of a specific circuit structure of the pulse output circuit will be described with reference to FIG. 11D.

Figure 11D:
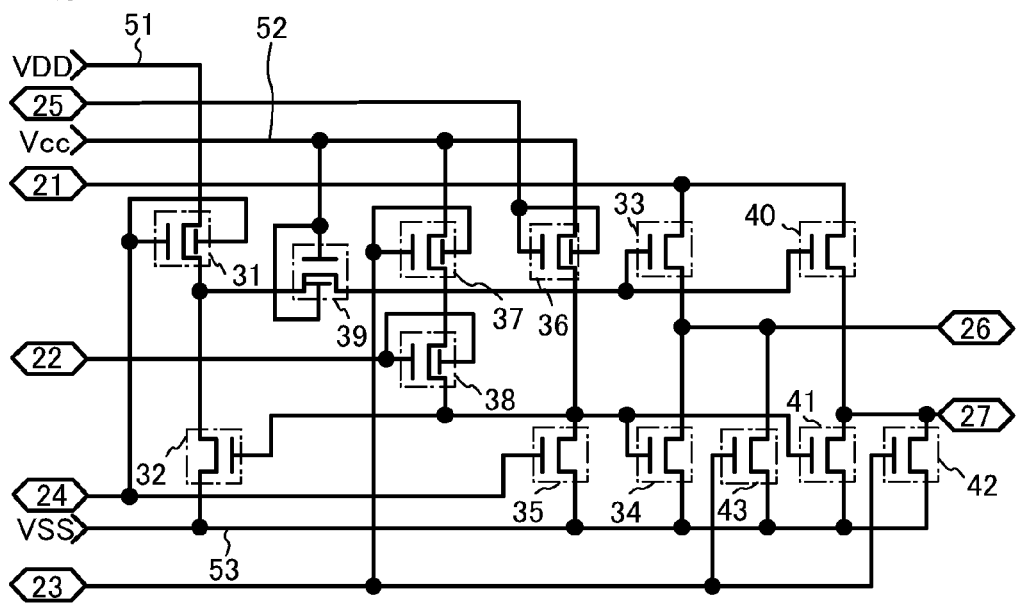

The pulse output circuit includes first to thirteenth transistors 31 to 43 (see FIG. 11D). Signals or power supply potentials are supplied to the first to thirteenth transistors 31 to 43 from a power supply line 51 to which a first power supply potential VDD is supplied, a power supply line 52 to which a second power supply potential VCC is supplied, and a power supply line 53 to which a third power supply potential VSS is supplied. Here, a magnitude relation of the power supply potential of each power supply line in FIG. 11D is as follows: the first power supply potential VDD is higher than or equal to the second power supply potential VCC and the second power supply potential VCC is higher than the third power supply potential VSS. Although the first to fourth clock signals (CK1) to (CK4) are signals each of which alternates between an H level signal and an L level signal at a constant cycle; and the potential is VDD when the clock signal is at the H level, and the potential is VSS when the clock signal is at the L level. The potential VDD of the power supply line 51 is set to be higher than the potential VCC of the power supply line 52, thereby reducing the potential applied to the gate electrode of the transistor without adversely effecting the operation; thus, the shift of the threshold value of the transistor can be reduced and deterioration can be suppressed. As shown in FIG. 11D, It is preferable that the thin film transistors 28 each having four terminals shown in FIG. 11C be used as the first transistor 31 and the sixth to ninth transistors 36 to 39 among the first transistor 31 to the thirteenth transistor 43. The first transistor 31 and the sixth to ninth transistors 36 to 39 are transistors by which the potential of a node connected to one electrode of a source and drain electrodes needs to be changed by a control signal to a gate electrode, and increase in the response speed to the control signal input to the gate electrode of each of them (steep rising of the on-current) can reduce malfunction of the pulse output circuit. Therefore, by using the thin film transistors 28 each having four terminals shown in FIG. 11C, the threshold voltage can be controlled, so that the malfunction of the pulse output circuit can be reduced. Although the first control signal G1 and the second control signal G2 are the same control signals in FIG. 11D, different control signals may be input.

In FIG. 11D, a first terminal of the first transistor 31 is electrically connected to the power supply line 51, a second terminal of the first transistor 31 is electrically connected to a first terminal of the ninth transistor 39, and a gate electrode (a lower gate electrode and an upper gate electrode) of the first transistor 31 is electrically connected to a fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode (a lower gate electrode and an upper gate electrode) of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode (a lower gate electrode and an upper gate electrode) of the seventh transistor 37 is electrically connected to the third terminal 23. A first terminal of the eighth transistor 38 is electrically connected to the gate electrode of the second transistor 32 and the gate electrode of the fourth transistor 34, and a gate electrode (a lower gate electrode and an upper gate electrode) of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and the gate electrode of the tenth transistor 40, and a gate electrode (a lower gate electrode and an upper gate electrode) of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and a gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrode (the lower gate electrode and the upper gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrode (the lower gate electrode and the upper gate electrode) of the seventh transistor 37.

In FIG. 11D, a connection point of the gate electrode of the third transistor 33, the gate electrode of the tenth transistor 40, and the second terminal of the ninth transistor 39 is referred to as a node A. In addition, a connection point of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is referred to as a node B.

Figure 12A:
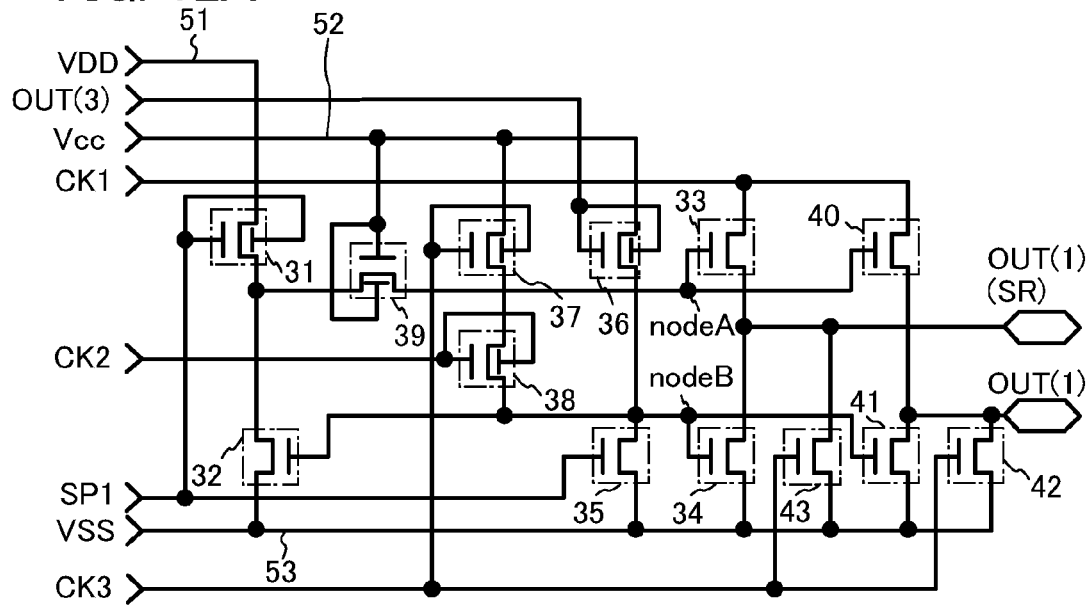
FIGS. 12A and 12B are a circuit diagram and a timing chart for describing an operation of a shift register.

In FIG. 12A, signals which are input or output to/from the first input terminal 21 to the fifth input terminal 25, the first output terminal 26, and the second output terminal 27 when the pulse output circuit described with reference to FIG. 11D is applied to the first pulse output circuit 10_1 are shown.

Specifically, the first clock signal CK1 is input to the first input terminal 21; the second clock signal CK2 is input to the second input terminal 22; the third clock signal CK3 is input to the third input terminal 23; the start pulse is input to the fourth input terminal 24; the next stage signal OUT (3) is input to the fifth input terminal 25; the first output signal OUT (1) (SR) is output from the first output terminal 26; and the second output signal OUT (1) is output from the second output terminal 27.

Note that a thin film transistor is an element having at least three terminals of a gate, a drain, and a source. The thin film transistor has a semiconductor in which a channel region is formed in a region overlapped with the gate, and current which flows between the drain and the source through the channel region can be controlled by controlling the potential of the gate. Here, since the source and the drain of the thin film transistor may interchange depending on the structure, the operating condition, and the like of the thin film transistor, it is difficult to define which is a source or a drain. Therefore, regions functioning as a source and a drain are not called a source and a drain in some cases; in that case, for example, one of the source and the drain may be referred to as a first terminal and the other thereof may be referred to as a second terminal.

In FIGS. 11D and 12A, a capacitor may be provided for performing a bootstrap operation with the node A in the floating state. Further, in order to keep the potential of the node B, a capacitor one electrode of which is electrically connected to the node B may be provided.

Figure 12B:
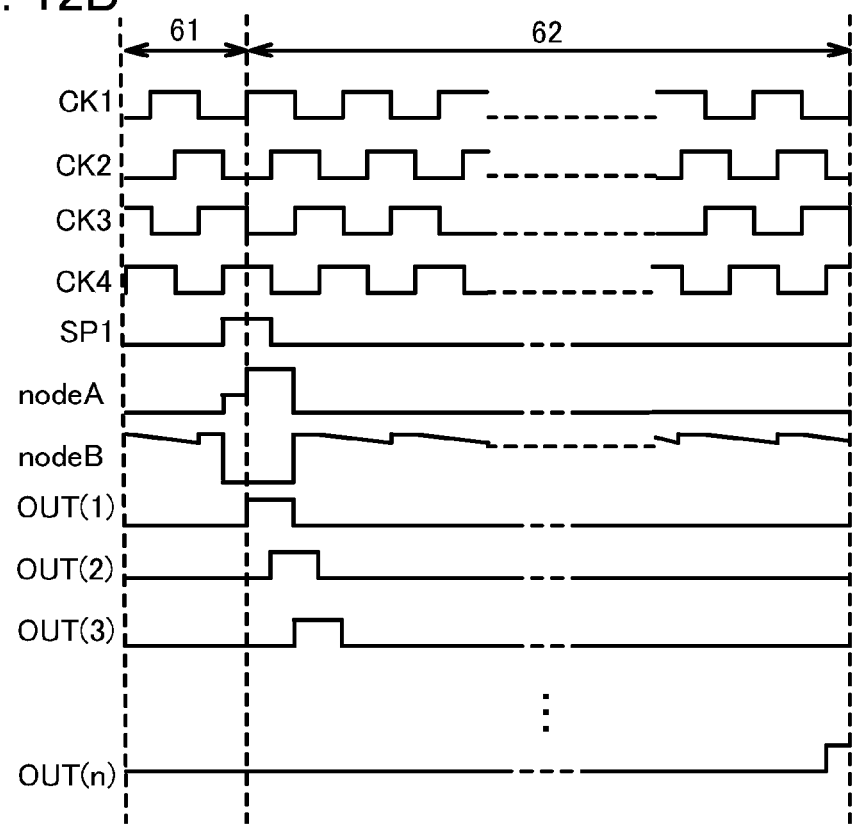

FIG. 12B shows a timing chart of a shift register including the plurality of pulse output circuits shown in FIG. 12A. In the case where the shift register is a scan line driver circuit, a period 61 in FIG. 12B is a vertical retrace period and a period 62 is a gate selection period.

As shown in FIG. 12A, the ninth transistor 39 whose gate is supplied with the second power supply potential VCC offers advantages described below before and after a bootstrap operation.

In the case where the ninth transistor 39 whose gate electrode is supplied with the second power supply potential VCC, as the potential of the node A is increased by the bootstrap operation, the potential of a source which is the second terminal of the first transistor 31 increases to a level higher than the first power supply potential VDD. Then, the first terminal of the first transistor 31, namely the power supply line 51, comes to serve as the source thereof. Therefore, in the first transistor 31, a large bias voltage is applied and thus significant stress is applied between the gate and the source and between the gate and the drain, which may cause deterioration of the transistor. The ninth transistor 39 whose gate electrode is supplied with the second power supply potential VCC can prevent the increase of the potential of the second terminal of the first transistor 31 while the potential of the node A is increased by the bootstrap operation. In other words, by providing the ninth transistor 39, a negative bias voltage applied between the gate and the source of the first transistor 31 can be reduced. Accordingly, with the circuit structure according to this embodiment, the negative bias voltage applied between the gate and the source of the first transistor 31 can be reduced, so that deterioration of the first transistor 31 due to stress can be suppressed.

The ninth transistor 39 may be provided so as to be connected between the second terminal of the first transistor 31 and the gate of the third transistor 33 through the first terminal and the second terminal thereof. In the case where a shift register including the plurality of pulse output circuits shown in this embodiment is used in a signal line driver circuit having more stages than a scan line driver circuit, the ninth transistor 39 may be omitted and the number of transistors can be reduced.

When an oxide semiconductor is used for semiconductor layers of the first transistor 31 to the thirteenth transistor 43, off-current of each thin film transistor can be reduced, on-current and field effect mobility can be increased, and the degree of deterioration can be increased; accordingly, malfunction in a circuit can be reduced. The degree of deterioration of the transistor formed using an oxide semiconductor, which is caused by application of a high potential to the gate electrode, is small in comparison with that of the transistor formed using amorphous silicon. Therefore, even when the first power supply potential VDD is supplied to a power supply line to which the second power supply potential VCC is supplied, a similar operation can be performed, and the number of power supply lines which are lead in the circuit can be reduced, so that the circuit can be miniaturized.

Even when a wiring connection is changed so that the clock signal which is supplied to the gate electrode (the lower gate electrode and the upper gate electrode) of the seventh transistor 37 through the third input terminal 23 and the clock signal which is supplied to the gate electrode (the lower gate electrode and the upper gate electrode) of the eighth transistor 38 through the second input terminal 22 are the clock signal which is supplied to the gate electrode (the lower gate electrode and the upper gate electrode) of the seventh transistor 37 through the second input terminal 22 and the clock signal which is supplied to the gate electrode (the lower gate electrode and the upper gate electrode) of the eighth transistor 38 through the third input terminal 23, respectively, a similar operation effect can be obtained. Note that in the shift register shown in FIG. 12A, In the case where after the seventh transistor 37 and the eighth transistor 38 are both on, the seventh transistor 37 is turned off and the eighth transistor 38 is kept to be on, and then the seventh transistor 37 is kept to be off and the eighth transistor 38 is turned off, a decrease in the potential of the node B, which is caused by a decrease in the potentials of the second input terminal 22 and the third input terminal 23, occurs twice because of a decrease in the potential of the gate electrode of the seventh transistor 37 and a decrease in the potential of the gate electrode of the eighth transistor 38. On the other hand, in the shift register shown in FIG. 12A, as shown in the FIG. 12B, in the case where after the seventh transistor 37 and the eighth transistor 38 are both on, the seventh transistor 37 is kept to be on and the eighth transistor 38 is turned off, and then the seventh transistor 37 is turned off and the eighth transistor 38 is kept to be off, the frequency of decrease in the potential of the node B, which is caused by the decreases in the potentials of the second input terminal 22 and the third input terminal 23, can be reduced to one which occurs when the potential of the gate electrode of the eighth transistor 38 is decreased. Therefore, it is preferable that a clock signal is supplied to the gate electrode (the lower gate electrode and the upper gate electrode) of the seventh transistor 37 from the third input terminal 23 and a clock signal is supplied to the gate electrode (the lower gate electrode and the upper gate electrode) of the eighth transistor 38 from the second input terminal 22; this is because the frequency of variation in the potential of the node B is reduced, so that noise can be reduced.

In this manner, in a period during which the potentials of the first output terminal 26 and the second output terminal 27 are kept at the L level, an H level signal is regularly supplied to the node B; accordingly, malfunction of a pulse output circuit can be suppressed.

Embodiment 8

In Embodiment 8, an example which is different from Embodiment 1 in the manufacturing process of a thin film transistor will be described with reference to FIGS. 8A to 8E. FIGS. 8A to 8E are the same as FIGS. 1A to 1E except a part of the process, which is different from FIGS. 1A to 1E, and therefore, the same portions are denoted by the same reference numerals, and specific description of the same portions is omitted.

First, in accordance with Embodiment 1, two gate electrode layers and a gate insulating layer 402 are formed over a substrate, and a source electrode layer 455a and a drain electrode layer 455b are formed to partly overlap one of the gate electrode layers. Then, an oxide semiconductor film is formed on the gate insulating layer 402, the source electrode layer 455a, and the drain electrode layer 455b.

Next, dehydration or dehydrogenation of the oxide semiconductor film is performed. First heat treatment for dehydration or dehydrogenation is performed at a temperature greater than or equal to 400° C. and less than the strain point of the substrate, preferably 425° C. or more. In the case where the temperature is 425° C. or more, the heat treatment time may be one hour or less, whereas in the case where the temperature is less than 425° C., the heat treatment time is longer than one hour. In this embodiment, the substrate is introduced into an electric furnace which is one of heat treatment apparatuses, the heat treatment of the oxide semiconductor layer is performed in a nitrogen atmosphere, and after that, the oxide semiconductor layer is not exposed to air, which prevents impurities such as water or hydrogen from entering the oxide semiconductor film; thus, an oxide semiconductor film is obtained. After that, a high-purity oxygen gas or $N_2O$ gas, or an ultra dry air (with a dew point of −40° C. or less, preferably −60° C. or less) is introduced into the same furnace, so that slow cooling is performed. It is preferable that water, hydrogen, and the like be not contained in the oxygen gas or the $N_2O$ gas. The purity of the oxygen gas or the $N_2O$ gas which is introduced into the heat treatment apparatus is preferably 6N (99.9999%) or more, more preferably 7N (99.99999%) or more (i.e., the concentration of impurities in the oxygen gas or the $N_2O$ gas is preferably 1 ppm or less, more preferably 0.1 ppm or less).

Further, after the first heat treatment for dehydration or dehydrogenation, heat treatment in an oxygen gas or an $N_2O$ gas at a temperature greater than or equal to 200° C. and less than or equal to 400° C., preferably greater than or equal to 200° C. and less than or equal to 300° C. may be performed.

Through the above process, the oxide semiconductor film is made to be in an oxygen-excess state so as to be a high-resistive, that is, i-type oxide semiconductor film. Although the first heat treatment for dehydration or dehydrogenation is performed just after the formation of the oxide semiconductor film in this embodiment, the first heat treatment for dehydration or dehydrogenation can be performed anytime after the formation of the oxide semiconductor film.

Next, the oxide semiconductor film and the gate insulating layer 402 are selectively etched by a photolithography step, so that a contact hole reaching the gate electrode layer 421b is formed. By formation of a resist on the oxide semiconductor film, contamination in the interface between the gate insulating layer 402 and the oxide semiconductor film can be prevented. Then, the resist mask is removed (see FIG. 8A).

Next, after the resist mask is removed, a resist mask is formed again thereon, and the oxide semiconductor film is selectively etched to be an island-shaped oxide semiconductor layer. Then, the resist mask is removed, so that oxide semiconductor layers 404 and 405 are formed over the gate insulating layer 402 (see FIG. 8B).

Next, an oxide insulating film is formed over the gate insulating layer 402 and the oxide semiconductor layers 404 and 405 by a sputtering method. Then, a resist mask is formed by a photolithography step, and etching is selectively performed thereon to form oxide insulating layers 426a and 426b. After that, the resist mask is removed. At this stage, in the oxide semiconductor layer, there are regions in contact with the oxide insulating layers. Among these regions, the region that overlaps the oxide insulating layer 426a, the gate electrode layer and the gate insulating layer is a channel formation region. There is also the region that overlaps the oxide insulating layer 426b covering the peripheral portion and side surface of the oxide semiconductor layer. By the photolithography, a contact hole reaching the gate insulating layer 421b and a contact hole reaching the drain electrode layer 455b are also formed (see FIG. 8C).

As the oxide insulating film formed, an inorganic insulating film that does not include impurities such as moisture, a hydrogen ion, and OH⁻ and blocks entry of these from the outside may be used. Typically, a silicon oxide film, a silicon nitride oxide film, an aluminum oxide film, an aluminum oxynitride film, or the like is used.

Next, an oxide conductive film and a metal conductive film are stacked on the gate insulating layer 402, the oxide insulating layers 426a and 426b, and the oxide semiconductor layer. By using a sputtering method, deposition of the stacked layer of the oxide conductive film and the metal conductive film can be performed continuously without exposure to air.

It is preferable that the oxide conductive film contain zinc oxide as its component but do not contain indium oxide. As materials of such an oxide conductive film, zinc oxide, zinc aluminum oxide, zinc aluminum oxynitride, zinc gallium oxide, and the like can be given. In this embodiment, a zinc oxide film is used.

As a material of the metal conductive film, an element selected from Ti, Mo, W, Al, Cr, Cu, and Ta, an alloy containing any of these elements as a component, an alloy containing these elements in combination, or the like is used. The metal conductive film is not limited to a single layer containing the above-described element and may be two or more layers. In this embodiment, a three-layer-stacked film in which a molybdenum film, an aluminum film, and a molybdenum film are stacked is formed.

Next, a resist mask is formed, and the metal conductive film is selectively etched, so that a source electrode layer 445a, a drain electrode layer 445b, a connection electrode layer 449, and a connection electrode layer 442 are formed. Then, the resist mask is removed. A resist stripper used for removing the resist mask is an alkaline solution, and in the case where the resist stripper is used, the zinc oxide film is selectively etched with the source electrode layer 445a, the drain electrode layer 445b, the connection electrode layer 449, and the connection electrode layer 442 as masks. In this manner, an oxide conductive layer 446a is formed under and in contact with the source electrode layer 445a, and an oxide conductive layer 446b is formed under and in contact with the drain electrode layer 445b. By providing the oxide conductive layer 446a between the source electrode layer 445a and the oxide conductive layer, contact resistance can be decreased, which leads to resistance reduction, so that a thin film transistor with high speed operation can be formed. The oxide conductive layer 446a provided between the source electrode layer 445a and the oxide conductive layer functions as a source region, and the oxide conductive layer 446b provided between the drain electrode layer 445b and the oxide conductive layer functions as a drain region, which are effective in improvement the frequency characteristics of a peripheral circuit (driver circuit). In the case where a molybdenum film and an oxide conductive layer are directly in contact with each other, the contact resistance is increased; this is because molybdenum is not readily oxidized as compared with titanium and thus extracts a small amount of oxygen from the oxide semiconductor layer 412, which does not allow the interface between the molybdenum and the oxide semiconductor layer 412 to be n-type. However, even in that case, by providing the oxide conductive layer 446a between the source electrode layer and the oxide conductive layer and providing the oxide conductive layer 446b between the drain electrode layer and the oxide conductive layer, the contact resistance can be decreased, and the frequency characteristics of the peripheral circuit (driver circuit) can be improved.

Figure 8A:
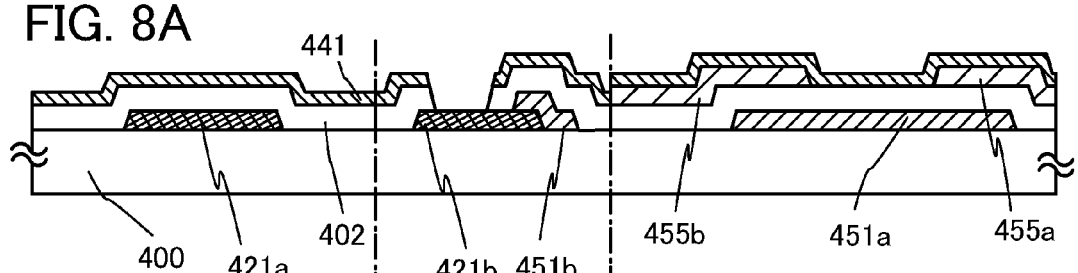
FIGS. 8A to 8E are cross-sectional views illustrating one embodiment of the present invention.
Figure 8B:
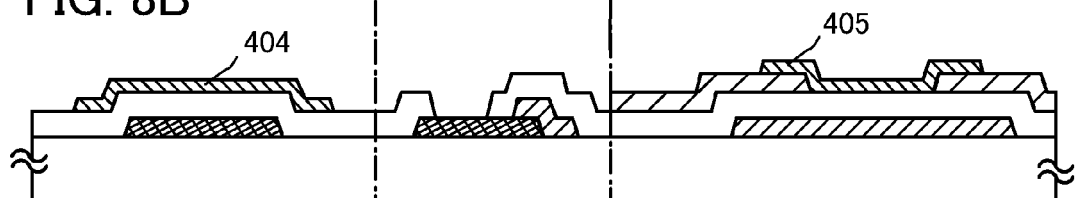
Figure 8C:
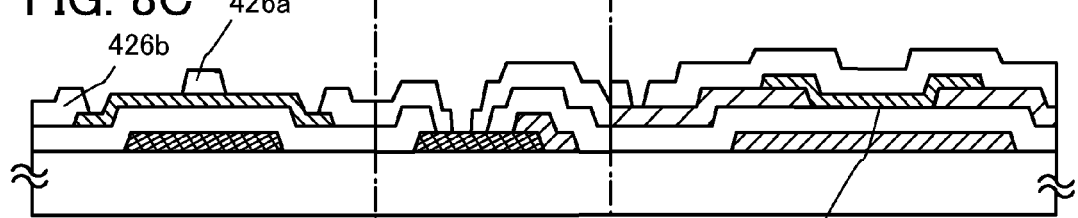
Figure 8D:
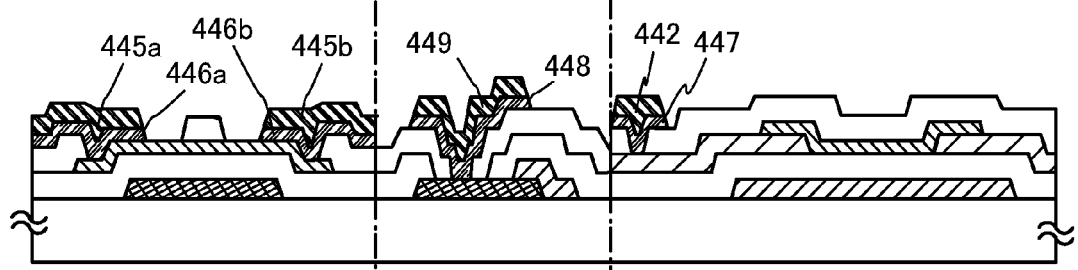

Further, by the same step, an oxide conductive layer 448 is formed under and in contact with the connection electrode layer 449, and an oxide conductive layer 447 is formed under and in contact with the connection electrode layer 442 (see FIG. 8D). By forming the oxide conductive layer 448 between the connection electrode layer 449 and the gate electrode layer 421b, buffer is formed, which is preferable, and an insulating oxide is not formed with a metal, which is preferable.

The etching rate is different between the oxide semiconductor layer and an oxide conductive layer, and therefore, the oxide conductive layer which is on and in contact with the oxide semiconductor layer can be removed by controlling the time of period.

After the metal conductive film is selectively etched, the resist mask may be removed by an oxygen ashing treatment to leave the zinc oxide film, and then, the zinc oxide film may be selectively etched with the source electrode layer 445a, the drain electrode layer 445b, the connection electrode layer 449, and the connection electrode layer 442 as masks.

In the case where the first heat treatment is performed after the metal conductive film is selectively etched, the oxide conductive layers 446a, 446b, 447, and 448 are crystallized as long as a crystallization inhibitor is not contained in the oxide conductive layers 446a, 446b, 447, and 448. On the other hand, the oxide semiconductor layer is not crystallized by the first heat treatment and is kept to be amorphous. A crystal of the oxide conductive layer is grown columnar with respect to the base plane thereof. As a result, when the metal film on the oxide conductive layer is etched to form the source and drain electrodes, formation of an undercut in the oxide conductive layer can be prevented.

Next, second heat treatment (preferably at a temperature greater than or equal to 150° C. and less than 350° C.) may be performed under an inert gas atmosphere or a nitrogen gas atmosphere in order to reduce variations of the electrical characteristics of thin film transistors. For example, heat treatment under a nitrogen atmosphere at 250° C. for one hour is performed. Oxygen diffusion is performed in the oxide semiconductor layer by the second heat treatment. The oxygen diffusion in the oxide semiconductor layer can make the resistance of the channel formation region high (make the region I-type). Accordingly, a normally-off thin film transistor can be obtained. The oxide conductive layers 446a, 446b, 447, and 448 can be crystallized by the second heat treatment, so that the conductivity can be improved.

Figure 8E:
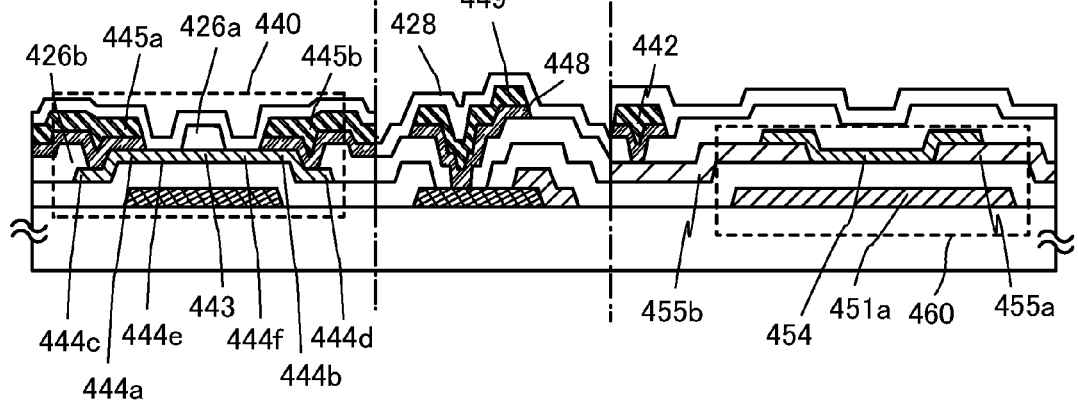

Next, an insulating layer 428 is formed over the oxide insulating layers 426a and 426b, the source electrode layer 445a, and the drain electrode layer 445b (see FIG. 8E).

Through the above process, a thin film transistor 440 and a thin film transistor 460 can be manufactured over one substrate.

The thin film transistor 440 provided in the driver circuit includes the gate electrode layer 421a, the gate insulating layer 402, the oxide semiconductor layer including a channel formation region 443, a high-resistive source region 444a, and a high-resistive drain region 444b, the oxide conductive layers 446a and 446b, the source electrode layer 445a, and the drain electrode layer 445b over the substrate 400 having an insulating surface. Further, the oxide insulating layer 426a which is in contact with the channel formation region 443 is provided. Further, the insulating layer 428 is provided over the source electrode layer 445a and the drain electrode layer 445b.

The oxide conductive layer 446a which functions as a source region is provided between the high-resistive source region 444a and the source electrode layer 445a and the oxide conductive layer 446b which functions as a drain region is provided between the high-resistive drain region 444b and the drain electrode layer 445b, by which the contact resistance can be reduced.

A first region 444c and a second region 444d of the oxide semiconductor layer, which overlap the oxide insulating layer 426b are in an oxygen-excess state like the channel formation region 443, by which the leak current is reduced and the parasitic capacitance is reduced. A third region 444e of the oxide semiconductor layer, which is in contact with the insulating layer 428 is provided between the channel formation region 443 and the high-resistive source region 444a. A fourth region 444f of the oxide semiconductor layer, which is in contact with the insulating layer 428 is provided between the channel formation region 443 and the high-resistive drain region 444b. By the third region 444e and the fourth region 444f of the oxide semiconductor layer, which are in contact with the insulating layer 428, off current can be decreased.

This embodiment can be combined with any one of Embodiments 1 to 7.

Embodiment 9

A light-emitting device disclosed in this specification can be applied to a variety of the electronic appliances (including an amusement machine). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

FIG. 13 illustrates an example of a mobile phone handset 1100. The mobile phone handset 1100 is provided with a display portion 1102 incorporated in a housing 1101, an operation button 1103, an external connection port 1104, a speaker 1105, a microphone 1106, and the like.

Figure 13A:
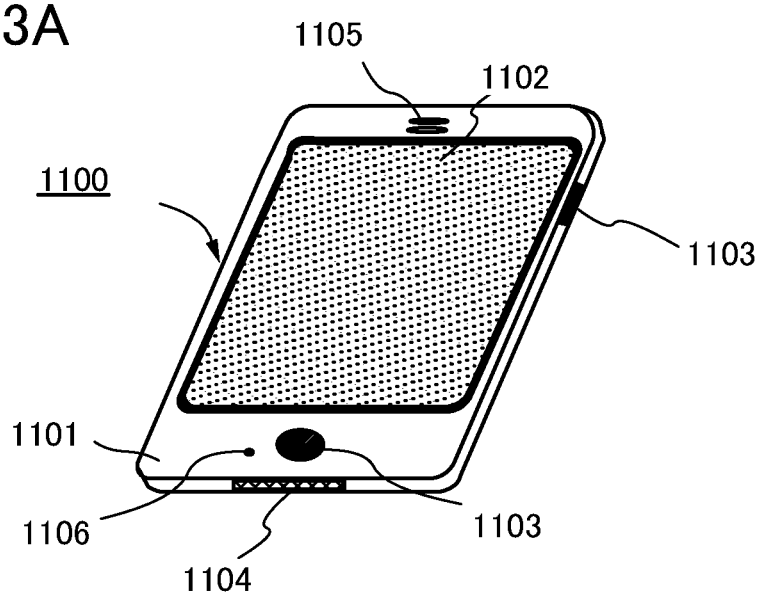
FIGS. 13A and 13B illustrate electronic appliances.

In the mobile phone handset 1100 illustrated in FIG. 13A, data can be input when by touching the display portion 1102 with a finger or the like. Further, operations such as making calls, composing mails, or the like can be performed by touching the display portion 1102 with a finger or the like.

There are mainly three screen modes of the display portion 1102. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1102 so that text displayed on a screen can be input. In that case, it is preferable to display a keyboard or number buttons on almost all area of the screen of the display portion 1102.

When a detection device including a sensor for detecting inclination, such as a gyroscope or an acceleration sensor, is provided inside the mobile phone handset 1100, display on the screen of the display portion 1102 can be automatically switched by determining the direction of the mobile phone handset 1100 (whether the mobile phone handset 1100 is placed horizontally or vertically for a landscape mode or a portrait mode).

The screen modes are switched by touching the display portion 1102 or operating the operation button 1103 of the housing 1101. Alternatively, the screen modes may be switched depending on the kind of the image displayed on the display portion 1102. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1102 is not performed for a certain period while a signal detected by the optical sensor in the display portion 1102 is detected, the screen mode may be controlled so as to be switched from the input mode to the display mode.

The display portion 1102 can also function as an image sensor. For example, an image of a palm print, a fingerprint, or the like is taken when the display portion 1102 is touched with a palm or a finger, whereby personal identification can be performed. Further, by providing a backlight or a sensing light source which emits a near-infrared light in the display portion, an image of a finger vein, a palm vein, or the like can be taken.

A plurality of thin film transistors 460 which is described in Embodiment 1 is arranged in the display portion 1102. Since the thin film transistors 460 have light transmitting properties, they do not block incident light in the case of providing an optical sensor in the display portion 1102 and thus are effective. In addition, also in the case of providing a backlight which emits near-infrared light or a sensing light source which emits near-infrared light in the display portion, the thin film transistors 460 and the wirings do not block light and thus are effective.

Figure 13B:
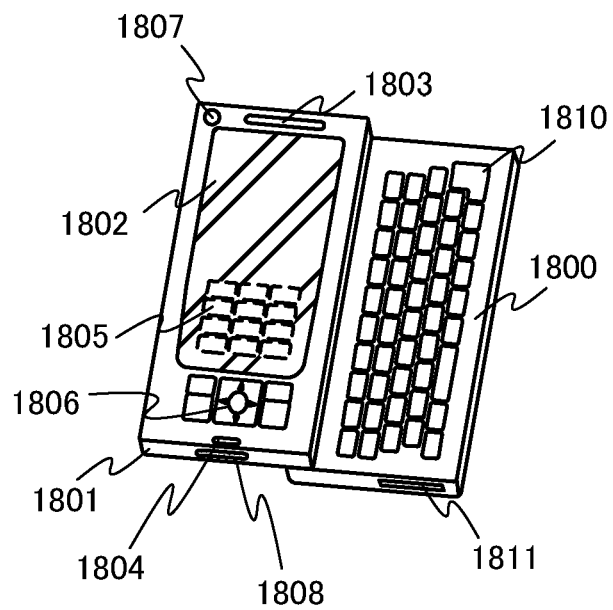

FIG. 13B illustrates another example of a mobile phone handset. A portable information terminal one example of which is shown in FIG. 13B can have a plurality of functions. For example, in addition to a telephone function, such a portable information terminal can have a function of processing a variety of data by incorporating a computer.

The portable information terminal illustrated in FIG. 13B includes a housing 1800 and a housing 1801. The housing 1800 includes a display panel 1802, a speaker 1803, a microphone 1804, an operation key 1805, a pointing device 1806, a camera lens 1807, an external connection terminal 1808, and the like. The housing 1801 includes a keyboard 1810, an external memory slot 1811, and the like. In addition, an antenna is incorporated in the housing 1801.

Further, the display panel 1802 is provided with a touch panel. A plurality of operation keys 1805 which is displayed as images is illustrated by dashed lines in FIG. 13B.

Further, in addition to the above structure, a contactless IC chip, a small memory device, or the like may be incorporated.

The light-emitting device of the present invention can be used for the display panel 1802 and the direction of display is changed appropriately depending on an application mode. Further, the camera lens 1807 is provided on the same surface as the display panel 1802, and thus it can be used as a video phone. The speaker 1803 and the microphone 1804 can be used for videophone calls, recording, and playing sound, etc. as well as voice calls. Moreover, the housings 1800 and 1801 in a state where they are developed as illustrated in FIG. 13B can be slided so that one is lapped over the other; therefore, the size of the portable information terminal can be reduced, which makes the portable information terminal suitable for being carried.

The external connection terminal 1808 can be connected to an AC adapter and various types of cables such as a USB cable, and charging and data communication with a personal computer are possible. Moreover, a storage medium can be inserted into the external memory slot 1811 so that a larger amount of data can be stored and can be moved.

In addition to the above functions, an infrared communication function, a television reception function, or the like may be provided.

Figure 14A:
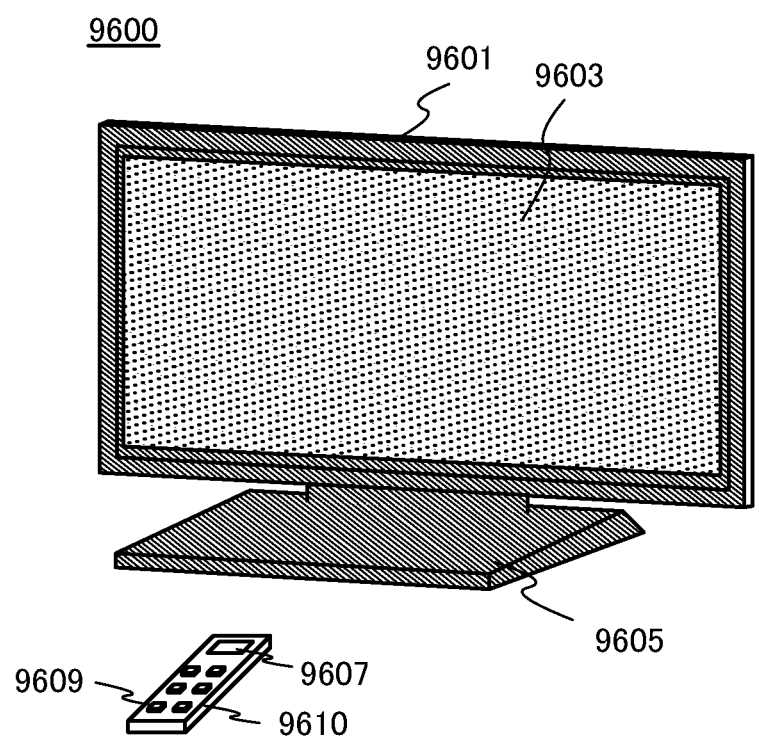
FIGS. 14A and 14B illustrate electronic appliances.

FIG. 14A illustrates an example of a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Since a plurality of the thin film transistors 460 described in Embodiment 1 is provided in the display portion 9603, the aperture ratio can be improved especially in the case where the light-emitting device is a bottom emission type.

Figure 14B:
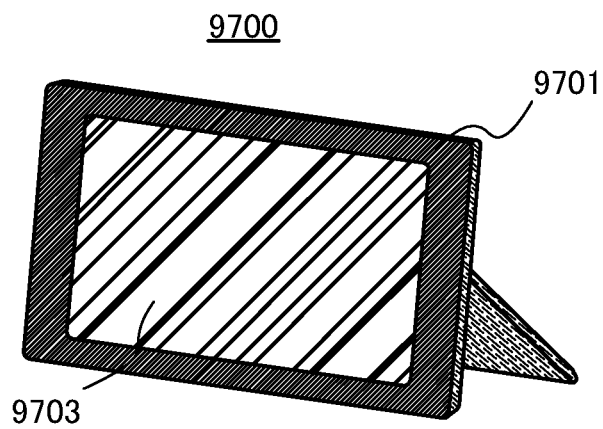

FIG. 14B illustrates an example of a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like so as to function as a normal photo frame.

Since a plurality of the thin film transistors 460 described in Embodiment 1 is provided in the display portion 9703, the aperture ratio can be improved especially in the case where the light-emitting device is a bottom emission type.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

In addition, the digital photo frame 9700 may be configured to transmit and receive data wirelessly. The structure may be employed in which desired image data is transferred wirelessly and displayed.

Figure 15:
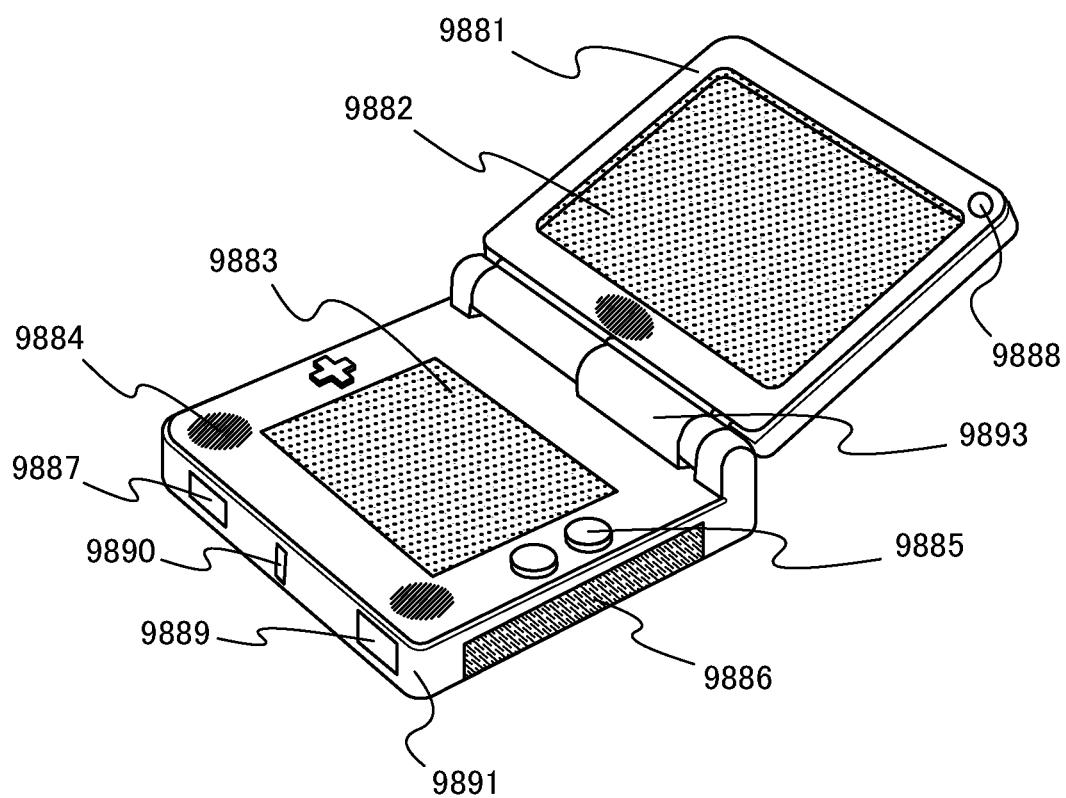
FIG. 15 illustrates an electronic appliance.

FIG. 15 is a portable game machine and includes two housings, a housing 9881 and a housing 9891, which are connected with a joint portion 9893 so that the portable game machine can be opened and folded. A display portion 9882 and a display portion 9883 are incorporated in the housing 9881 and the housing 9891, respectively.

Since a plurality of the thin film transistors 460 described in Embodiment 1 is provided in the display portion 9883, the aperture ratio can be improved especially in the case where the light-emitting device is a bottom emission type.

Further, the portable game machine illustrated in FIG. 15 is provided with a speaker portion 9884, a recording medium insert portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable amusement machine is not limited to the above and other structures provided with at least a thin film transistor disclosed in this specification can be employed. The portable amusement machine may include other accessory equipment as appropriate. The portable game machine illustrated in FIG. 15 has a function of reading out a program or data stored in a storage medium to display on the display portion, and a function of sharing information with another portable game machine by wireless communication. Note that the portable amusement machine illustrated in FIG. 15 can have various functions without limitation to the above.

Figure 16:
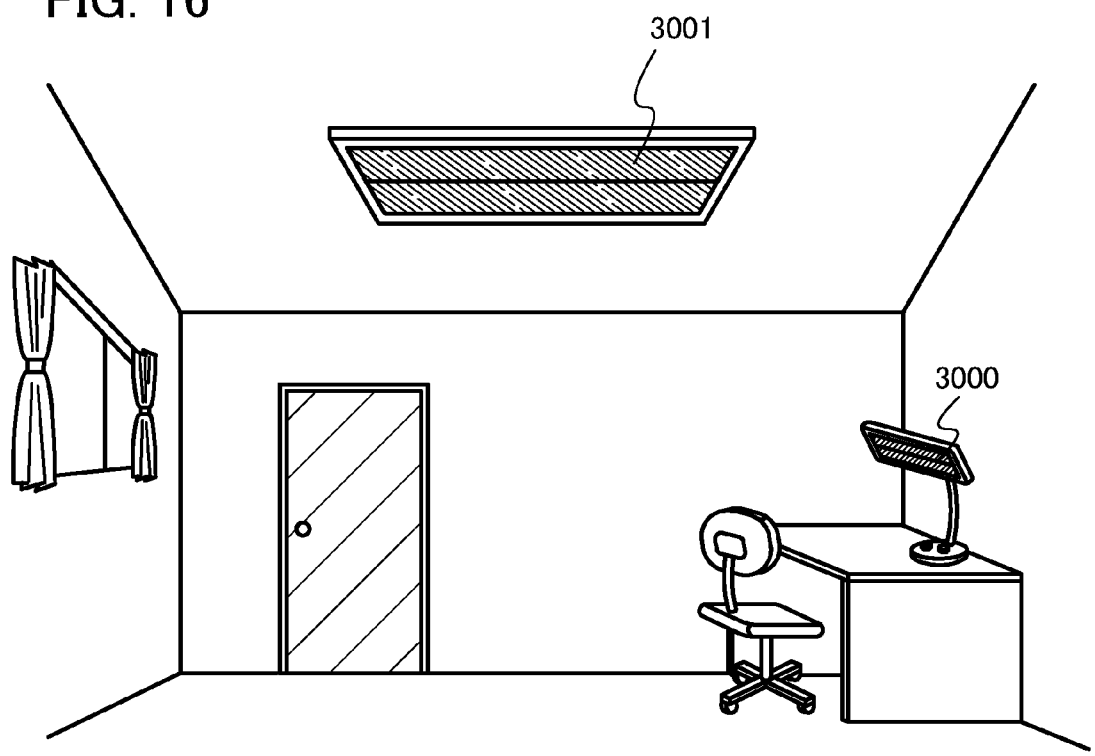
FIG. 16 illustrates an electronic appliance.

FIG. 16 is an example in which the light-emitting device formed in accordance with the above embodiment is used as an indoor lighting device 3001. Since the light-emitting device described in Embodiment 2 can be enlarged, the light-emitting device can be used as a lighting device having a large area. Further, the light-emitting device described in Embodiment 2 can be used as a desk lamp 3000. Note that the lighting equipment includes in its category, a ceiling light, a wall light, a lightning for an inside of a car, an emergency exit light, and the like.

As described above, the light-emitting device described in Embodiment 2 and 3 can be arranged in display panels of a variety of electronic appliances such as the above ones. A highly reliable electronic appliance having a display portion with a high aperture ratio especially in the case where the light-emitting device is a bottom emission type can be provided by using the thin film transistor 450 for a driver circuit, and by using the thin film transistor 460 as a switching element of the display panel.

This application is based on Japanese Patent Application serial no. 2009-185252 filed with Japan Patent Office on Aug. 7, 2009, the entire contents of which are hereby incorporated by reference.

What is claimed is:
1. A light-emitting device comprising:
a pixel portion over a substrate, and comprising:
a first thin film transistor comprising:
a first gate electrode layer over the substrate;
a first gate insulating layer over the first gate electrode layer;
a first source electrode layer and a first drain electrode layer over the first gate insulating layer; and
a first oxide semiconductor layer over the first gate insulating layer, and overlapping with the first source electrode layer and the first drain electrode layer;
a first oxide insulating layer which is in contact with the first oxide semiconductor layer;
a connection electrode layer over the first oxide insulating layer, and electrically connected to the first drain electrode layer;
a color filter layer over the first oxide insulating layer;
a first electrode over the color filter layer, and electrically connected to the connection electrode layer;
a light-emitting layer over the first electrode; and
a second electrode over the light-emitting layer;
a driver circuit over the substrate, and comprising:
a second thin film transistor comprising:
a second gate electrode layer over the substrate;
a second gate insulating layer over the second gate electrode layer;
a second oxide semiconductor layer over the second gate insulating layer;
a second oxide insulating layer over the second oxide semiconductor layer;

a second source electrode layer and a second drain electrode layer on and in contact with the second oxide semiconductor layer; and an insulating layer over the second oxide insulating layer, the second source electrode layer and the second drain electrode layer and in contact with the second oxide semiconductor layer, wherein the second oxide insulating layer includes a first region and a second region, wherein the first region is in contact with the second oxide semiconductor layer so as to overlap with the second gate electrode layer, wherein the second region is in contact with the second oxide semiconductor layer so as to cover an end portion of the second oxide semiconductor layer, wherein the second region is sandwiched between the second oxide semiconductor layer and one of the second source electrode layer and the second drain electrode layer, and wherein the first gate electrode layer, the first gate insulating layer, the first oxide semiconductor layer, the first source electrode layer, the first drain electrode layer, the first oxide insulating layer, and the first electrode have a light-transmitting property.

2. The light-emitting device according to claim 1, wherein a material of the second source electrode layer and the second drain electrode layer is different from a material of the first source electrode layer and the first drain electrode layer, and wherein a resistance of the material of the second source electrode layer and the second drain electrode layer is lower than a resistance of the material of the first source electrode layer and the first drain electrode layer.

3. The light-emitting device according to claim 1, wherein the connection electrode layer is formed using a film including an element selected from Al, Cr, Cu, Ta, Ti, Mo, and W as its main component or a stacked-layer film including the film and an alloy film of any of the elements.

4. The light-emitting device according to claim 1, wherein the second source electrode layer and the second drain electrode layer are the same materials as the connection electrode layer.

5. The light-emitting device according to claim 1, wherein the first source electrode layer and the first drain electrode layer are indium oxide, an alloy of indium oxide and tin oxide, an alloy of indium oxide and zinc oxide, or zinc oxide.

6. The light-emitting device according to claim 1, wherein the first oxide insulating layer and the second oxide insulating layer are a silicon oxide film or an aluminum oxide film formed by a sputtering method.

7. The light-emitting device according to claim 1, wherein the second thin film transistor includes an oxide conductive layer between the second oxide semiconductor layer and the second source electrode layer and an oxide conductive layer between the second oxide semiconductor layer and the second drain electrode layer.

8. A method for manufacturing a light-emitting device, comprising the steps of:

forming a first gate electrode layer and a second gate electrode layer;

forming a gate insulating layer over the first gate electrode layer and the second gate electrode layer;

forming a first source electrode layer and a first drain electrode layer over the gate insulating layer so as to overlap the first gate electrode layer;

forming over the gate insulating layer, a first oxide semiconductor layer so as to overlap the first gate electrode layer, a part of the first source electrode layer, and a part of the first drain electrode layer, and a second oxide semiconductor layer so as to overlap the second gate electrode layer;

forming an oxide insulating layer over the second oxide semiconductor layer;

forming a second source electrode layer and a second drain electrode layer over the second oxide semiconductor layer, and forming a connection electrode layer over the oxide insulating layer so as to be electrically connected to the first drain electrode layer;

forming an insulating layer over the oxide insulating layer, the second source electrode layer and the second drain electrode layer and in contact with the second oxide semiconductor layer;

forming a color filter layer over the oxide insulating layer which overlaps with the first oxide semiconductor layer; and forming over the color filter layer, a first electrode which is electrically connected to the connection electrode layer, a light-emitting layer, and a second electrode, wherein the oxide insulating layer includes a first region and a second region, wherein the first region is in contact with the second oxide semiconductor layer so as to overlap with the second gate electrode layer, wherein the second region is in contact with the second oxide semiconductor layer so as to cover an end portion of the second oxide semiconductor layer, and wherein the second region is sandwiched between the second oxide semiconductor layer and one of the second source electrode layer and the second drain electrode layer.

* * * * *

UNITED STATES PATENT AND TRADEMARK OFFICE
CERTIFICATE OF CORRECTION

| | | |
|---|---|---|
| PATENT NO. | : 8,492,764 B2 | Page 1 of 1 |
| APPLICATION NO. | : 12/848375 | |
| DATED | : July 23, 2013 | |
| INVENTOR(S) | : Shunpei Yamazaki et al. | |

It is certified that error appears in the above-identified patent and that said Letters Patent is hereby corrected as shown below:

On the Title Page, at item (73), "Semicondcutor" should be --Semiconductor--.

In the Specification

Column 34, line 62 "102" should be --10_2--.

Signed and Sealed this
Fifteenth Day of October, 2013

Teresa Stanek Rea
*Deputy Director of the United States Patent and Trademark Office*